United States Patent
Kitamura

(10) Patent No.: US 6,812,065 B1
(45) Date of Patent: Nov. 2, 2004

(54) ANISOTROPIC CONDUCTIVE PASTE

(75) Inventor: Tadashi Kitamura, Yokohama (JP)

(73) Assignees: Mitsui Chemicals, Inc., Tokyo (JP); Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/701,602

(22) PCT Filed: Mar. 30, 2000

(86) PCT No.: PCT/JP00/02025
§ 371 (c)(1),
(2), (4) Date: Nov. 30, 2000

(87) PCT Pub. No.: WO00/60614
PCT Pub. Date: Oct. 12, 2000

(30) Foreign Application Priority Data

Apr. 1, 1999 (JP) .......................................... 11-094582

(51) Int. Cl.[7] .......................... H01L 21/02; C09K 19/52; C09J 9/02; C09J 163/00; G02F 1/1339
(52) U.S. Cl. .......................... 438/119; 156/99; 156/330; 349/122; 349/153; 252/518.1; 252/521.3; 428/1.1; 428/1.5; 428/1.52; 428/1.53; 428/413; 428/414; 428/415; 428/417
(58) Field of Search .......................... 252/500, 512, 252/518.1, 521.3; 438/119; 523/400, 440, 457; 156/99, 330; 349/122, 153; 427/96, 386; 428/1.1, 1.5, 1.52, 1.53, 413, 414, 415, 417

(56) References Cited

U.S. PATENT DOCUMENTS 4,696,764 A * 9/1987 Yamazaki .................... 252/503
5,665,797 A * 9/1997 Tahara et al. ................ 523/400
5,898,041 A * 4/1999 Yamada et al. ................ 522/81
6,139,777 A * 10/2000 Omoya et al. .............. 252/500
6,165,386 A * 12/2000 Endo et al. .................. 252/500
6,583,834 B1 * 6/2003 Uchiyama .................... 349/122

FOREIGN PATENT DOCUMENTS

| JP | 4-323290 | 11/1992 |
|---|---|---|
| JP | 5-347464 | 12/1993 |
| JP | 9-306234 | 11/1997 |
| JP | 10-168412 | 6/1998 |
| JP | 11-339559 | 12/1999 |
| JP | 11-345517 | 12/1999 |
| JP | 2000-21236 | 1/2000 |

OTHER PUBLICATIONS

Kodera et al. English Translation of JP 06–267328, Sep. 1994–obtained from the JPO website.*

* cited by examiner

Primary Examiner—Jeffrey B. Robertson
(74) Attorney, Agent, or Firm—Burns, Doane, Swecker & Mathis, L.L.P.

(57) ABSTRACT

Provided is an anisotropic conductive paste in which an aqueous solution obtained by admixing the anisotropic conductive paste with purified water has an ionic conductivity of 1 mS/m or less; the B stage-reduced composition has a viscosity of 50 to 10000 Pa.s at 80 to 100° C.; and the cured matter of the anisotropic conductive paste has a linear expansion coefficient of $10 \times 10^{-5}$ mm/mm/° C. or less at 0 to 100° C., a heat deformation temperature Tg of 100° C. or higher, a water absorption coefficient of 2 mass % or less and a specific resistance of $1 \times 10^9 \Omega$.cm or more.

24 Claims, No Drawings

ANISOTROPIC CONDUCTIVE PASTE

TECHNICAL FIELD

The present invention relates to an anisotropic conductive paste and a method of electrically connecting complicated electric circuits or forming an electric connection circuit of a liquid crystal display board with a semiconductor IC and/or an IC-loaded circuit board.

BACKGROUND ART

In recent years, as various devices including a personal computer are miniaturized and thinned, it has been increasingly difficult to connect very fine electric circuits themselves. In particular, a work to instill a semiconductor IC and IC-loaded circuit board on a narrow place becomes increasing. A means for electrically connecting them at a time used to rely on an advance in a soldering technique in the past. However, the existing situation is that in recent years, the connection is carried out by using an anisotropic conductive film.

However, in using an anisotropic conductive film, a work for peeling releasing paper and a punching work for molding are required. In order to save such works, it is essential to install an automatic peeling machine, an automatic punching machine and an automatic adhesion machine in combination, which are expensive, and there are the problems that a risk of an equipment investment is involved and a lot of wastes of an expensive anisotropic conductive film is produced.

On the other hand, anisotropic conductive pastes which are liquid at room temperature are proposed as those producing fewer wastes in the above field. Known are, for example, an anisotropic conductive paste prepared by providing an insulating layer on a conductive particle surface and dispersing the particle in an insulating adhesive component and an anisotropic conductive paste composition prepared by dispersing a conductive rubber particle in an insulating adhesive.

An anisotropic conductive paste means a thermosetting type liquid composition of a single liquid type by which fine conductive circuits themselves are connected, whereby the paste makes it possible to electrically connect and fix the circuits on upper and lower boards.

In recent years, an anisotropic conductive paste is strongly required to meet severe use, and those which are free of a resin-leaking phenomenon and bleeding contamination that occurs in a production line involving quick heat application and which do not cause problems such as inferior conduction between electrodes in a bonding direction and inferior insulation characteristics in a direction perpendicular to the bonding direction tend to be required.

The existing situation is that strongly desired to be developed particularly in the above field is an anisotropic conductive paste which is excellent in a pre-bonding property and does not cause resin leaking even under such severe hot press bonding conditions for maintaining high productivity as, for example, lower than 200° C., a pressure of 2 MPa/m$^2$ and 20 to 30 seconds and which has a high adhesion reliability.

In light of the social background described above, a subject to be solved by the present invention is to provide an anisotropic conductive paste satisfying the following problems at the same time.

That is, the subject is to provide an anisotropic conductive paste which does not substantially cause resin leaking and bubble generation in hot press bonding and curing and is non-contaminative and which is easy in hot press bonding and curing at 30 to 200° C. for short time and can achieve highly reliable electric connection accompanied with anisotropy. Further, the subject is to provide a method of electrically connecting complicated electric circuits or forming an electric connection circuit of a liquid crystal display board with a semiconductor IC and/or an IC-loaded circuit board by using the above anisotropic conductive paste.

DISCLOSURE OF THE INVENTION

Intensive investigations repeated by the present inventors in order to solve the problems described above have resulted in finding that the subjects described above can be achieved by employing an anisotropic conductive paste that comprises an epoxy resin as a principal component and contains each specific amount of a rubber-like polymer fine particle, a thermally active potential curing agent for epoxy resin and a high softening point-polymer fine particle, a conductive particle having a specific size and if necessary, an inorganic filler, a silane coupling agent, a solvent which is compatible with the epoxy resin and has a boiling point falling in a range of 150 to 220° C. and which is inactive to an epoxy group, and other additives, and thus the present invention has been completed.

That is, the anisotropic conductive paste of the present invention comprises the following items [1] to [11]:

[1] An anisotropic conductive paste comprising conductive fine particles and an epoxy resin composition, wherein (a) an aqueous solution obtained by sufficiently admixing the above anisotropic conductive paste with the same mass of purified water has an ionic conductivity of 1 mS/m or less and (b) a coated material obtained by coating the above anisotropic conductive paste in a thickness of 50 µm and subjecting it to heat treatment at 80 to 100° C. for 20 minutes has a viscosity of 50 to 10000 Pa.s at 80 to 100° C. by an E type viscometer, (c) the cured matter of the above anisotropic conductive paste has a linear expansion coefficient of $10 \times 10^{-5}$ mm/mm/° C. or less at 0 to 100° C., which is determined by means of a thermomechanical analyzer (TMA), (d) the cured matter of the above anisotropic conductive paste has a heat deformation temperature Tg of 100° C. or higher, which is determined by means of a thermomechanical analyzer (TMA), (e) the cured matter of the above anisotropic conductive paste has a water absorption coefficient of 2 mass % or less, and (f) the cured matter of the above anisotropic conductive paste has a specific resistance of $1 \times 10^9 \Omega$.cm or more.

[2] The anisotropic conductive paste as described in the above item [1], wherein the above epoxy resin composition comprises:

(1) 30 to 93 mass % of an epoxy resin having 1.2 or more epoxy groups on an average in a molecule, (2) 1 to 15 mass % of a rubber-like polymer fine particle having a softening point of 0° C. or lower and a primary particle diameter of 5 µm or less, (3) 5 to 60 mass % of a thermally active potential curing agent for epoxy resin, and (4) 1 to 20 mass % of a high softening point-polymer fine particle having a softening point of 50° C. or higher and a primary particle diameter of 2 µm or less, and wherein the above anisotropic conductive paste comprises; 93 to 97 volume % of the epoxy resin composition comprising the components (1) to (4) described above, and (5) 3 to 7 volume % of a conductive particle having an average particle diameter of 5 to 15 µm, a maximum particle diameter of 20 µm or less and a minimum particle diameter of 0.1 µm or more.

[3] The anisotropic conductive paste as described in the above item [2], further comprising 1 to 10 mass % of an inorganic filler.

[4] The anisotropic conductive paste as described in the above item [2] or [3], further comprising 0.1 to 5 mass % of a silane coupling agent.

[5] The anisotropic conductive paste as described in any of the above items [2] to [4], wherein a maximum exothermic peak temperature determined from a thermogram obtained by differential scanning calorimetry (DSC) in which 10 mg of the above anisotropic conductive paste is heated at a constant rate of 5° C./minute in an inert gas atmosphere is 80 to 180° C.

[6] The anisotropic conductive paste as described in any of the above items [2] to [5], comprising a single liquid type epoxy resin composition, wherein an exothermic initiation temperature determined from a thermogram obtained by differential scanning calorimetry (DSC) in which 10 mg of the above anisotropic conductive paste is heated at a constant rate of 5° C./minute in an inert gas atmosphere is 30 to 130° C.

[7] The anisotropic conductive paste as described in any of the above items [4] to [6], wherein the epoxy resin (1) described above is an epoxy resin having 1.7 or more epoxy groups on an average in a molecule and has a polystyrene-reduced number average molecular weight of 7000 or less which is determined by gel permeation chromatography.

[8] The anisotropic conductive paste as described in any of the above items [4] to [7], wherein the components (2), (4) and (5) are present in the state that they are dispersed in the epoxy resin in the form of particles respectively.

[9] The anisotropic conductive paste as described in any of the above items [4] to [8], wherein the fine particle (4) is a high softening point-polymer fine particle which comprises a poly(meth)acrylate having a micro cross-linking structure as a main component and has a softening point of 60 to 150° C. and a primary particle diameter falling in a range of 0.01 to 2 µm, in which an epoxy group is introduced into a polymer component in a proportion of 0.1 to 5 mass %.

[10] The anisotropic conductive paste as described in any of the above items [4] to [9], wherein the conductive particle (5) comprises a core of an organic polymer and a coated layer of at least one metal selected from gold, silver, copper, nickel or an alloy thereof.

[11] A method of forming an electric connection circuit of a liquid crystal display board with a semiconductor IC and/or an IC-loaded circuit board by dispenser-coating the anisotropic conductive paste as described in any of the above items [2] to [10] on a part of the liquid crystal display board to be electrically connected with the semiconductor IC and/or the IC-loaded circuit board and press bonding them by means of a normal heat press at a temperature lower than 250° C. to adhere and fix them making use of a thermal curing reaction of the above anisotropic conductive paste to thereby make vertically conductive and form an electric conductive circuit.

BEST MODE FOR CARRYING OUT THE INVENTION

The anisotropic conductive paste is preferably an anisotropic conductive paste comprising conductive fine particles and an epoxy resin composition, wherein (a) an aqueous solution obtained by sufficiently admixing the above anisotropic conductive paste with the same mass of purified water has an ionic conductivity of 1 mS/m or less and (b) a coated material obtained by coating the above anisotropic conductive paste in a thickness of 50 µm and subjecting it to heat treatment at 80 to 100° C. for 20 minutes has a of 50 to 10000 Pa.s at 80 to 100° C. by an E type viscometer, and (c) the cured matter of the above anisotropic conductive paste has a linear expansion coefficient of $10 \times 10^{-5}$ mm/mm/° C. or less at 0 to 100° C., which is determined by means of a thermomechanical analyzer (TMA), (d) the cured matter of the above anisotropic conductive paste has a heat deformation temperature Tg of 100° C. or higher, which is determined by means of a thermomechanical analyzer (TMA), (e) the cured matter of the above anisotropic conductive paste has a water absorption coefficient of 2 mass % or less, and (f) the cured matter of the above anisotropic conductive paste has a specific resistance of $1 \times 10^9 \Omega.cm$ or more.

The condition of (b) is, for example, a physical property required for a sealing material in a heating and adhering step in electrically connecting a liquid crystal display board with a semiconductor IC and/or an IC-loaded circuit board, to be more specific, in a B stage. A viscosity of this B stage-reduced composition at a revolution of 0.5 rpm by an E type viscometer is controlled to 50 Pa.s or more at 80 to 100° C., whereby resin leaking or bleeding is notably inhibited from being caused, for example, at the time of normal hot press type hot press bonding, and can substantially be prevented from being caused. Also, the viscosity at 80 to 100° C. is controlled to 10000 Pa.s or less, whereby the desired anisotropic conductivity can preferably be secured, for example, at the time of normal hot press type hot press bonding. Further, the viscosity of the B stage-reduced composition described above at 80 to 100° C. is controlled more preferably to a range of 75 to 8000 Pa.s, particularly preferably 100 to 5000 Pa.s.

Further, a water absorption coefficient of the cured matter of the anisotropic conductive paste is controlled to 2 mass % or less, whereby electric connection reliability and stability can markedly be elevated.

In the anisotropic conductive paste of the present invention, the cured matter thereof has a specific resistance of preferably $1 \times 10^9 \Omega.cm$ or more, more preferably $1 \times 10^{10} \Omega.cm$ or more and particularly preferably $1 \times 10^{11} \Omega.cm$ or more. The insulating characteristic which is inevitable between electrode terminals on the same plane can be secured and the arch resistance can be raised by controlling the specific resistance of the cured matter to $1 \times 10^9 \Omega.cm$ or more.

Further, the heat deformation temperature characteristic (Tg characteristic) of the cured matter of the anisotropic conductive paste is controlled to a specific range, whereby a range of temperature area for the durable use can be expanded. In particular, the use thereof under a higher temperature than required in recent years becomes possible.

That is, the heat deformation temperature (Tg) of the cured matter, which is determined by means of a thermomechanical analyzer (TMA), is controlled to 100° C. or higher, whereby better connection reliability of the resulting electric connection circuit can be secured for long time, and therefore such temperature is preferred. The heat deformation temperature is more preferably 110° C. or higher and falls particularly preferably in a range of 115 to 180° C. in terms of Tg.

Further, the linear expansion coefficient of the cured matter of the anisotropic conductive paste at 0 to 100° C. is controlled to a specific range, whereby the connection stability of the resulting electric connection circuit can be secured.

That is, the linear expansion coefficient of the cured matter of the anisotropic conductive paste, which is determined by means of a thermomechanical analyzer (TMA) is controlled to $10 \times 10^{-5}$ mm/mm/° C. or less, whereby the wirings can be prevented from being broken for long time even under a high temperature and a high humidity. The cured matter of the anisotropic conductive paste has preferably a linear expansion coefficient of less than $5 \times 10^{-5}$ mm/mm/° C., more preferably less than $3 \times 10^{-5}$ mm/mm/° C.

In the anisotropic conductive paste of the present invention, a barometer of a free ion concentration in the anisotropic conductive paste is an ionic conductivity of an aqueous solution prepared by sufficiently admixing the anisotropic conductive paste with the same mass of purified water, and the ionic conductivity thereof is controlled preferably to 1 ms/m or less, whereby a change rate of the anisotropic conductivity with the passage of time under a humidified environment can be reduced. It is controlled more preferably to 0.5 mS/m or less, particularly preferably 0.2 mS/m or less.

The anisotropic conductive paste of the present invention comprises 93 to 97 volume % of the epoxy resin composition comprising the following components (1) to (4) and 3 to 7 volume % of the conductive particles (5) having an average particle diameter of 5 to 15 μm, a maximum particle diameter of 20 μm or less and a minimum particle diameter of 0.1 μm or more.

The above epoxy resin composition comprises:
(1) 30 to 93 mass % of an epoxy resin having 1.2 or more epoxy groups on an average in a molecule,
(2) 1 to 15 mass % of a rubber-like polymer fine particle having a softening point of 0° C. or lower and a primary particle diameter of 5 μm or less,
(3) 5 to 60 mass % of a thermally active potential curing agent for epoxy resin, and
(4) 1 to 20 mass % of a high softening point-polymer fine particle having a softening point of 50° C. or higher and a primary particle diameter of 2 μm or less.

The anisotropic conductive paste of the present invention comprises the components (1) to (5) described above and if necessary, (6) an inorganic filler, (7) a silane coupling agent, (8) a solvent which is compatible with the epoxy resin and which is inactive to an epoxy group (hereinafter referred to merely as the solvent), and other additives.

The structural components shall specifically be explained below.

(1) Epoxy resin

The epoxy resin (1) used in the present invention is an epoxy resin having 1.2 or more epoxy groups on an average in a molecule. It has preferably 1.7 or more epoxy groups, particularly preferably 2 to 6 epoxy groups on an average in a molecule. The epoxy group is controlled to 1.2 or more groups on an average in a molecule, whereby the heat resistance is improved, and therefore such number of epoxy groups is preferred. The epoxy resin may be a single resin or a mixture of different resins, and the resins which are either solid or liquid at room temperature can be used.

It shall not specifically be restricted, and the number of functional groups per a molecule of the above epoxy resin contained in the anisotropic conductive paste can be obtained by fractionating by means of a liquid chromatography to determine the epoxy equivalent and the mass average molecular weight.

These epoxy resins shall not specifically be restricted as long as they are epoxy resins having prescribed epoxy groups or mixtures thereof, and monofunctional epoxy resins, multifunctional epoxy resins and modified epoxy resins can be used alone or in combination of a plurality thereof.

The particularly preferred epoxy resin has an ionic conductivity of preferably 2 mS/m or less, more preferably 1 mS/m or less and particularly preferably 0.5 mS/m or less in terms of an ionic conductivity of extract water which is obtained by contacting and mixing the single resin or the mixture of a plurality thereof with the same mass of purified water for 10 to 30 minutes.

If the above extract water has an ionic conductivity of 2 mS/m or less, a free ion can notably be inhibited or substantially prevented from transferring from the cured matter which is finally obtained from the anisotropic conductive paste of the present invention. Further, this can substantially avoid the electrodes from being corroded. When two or more different kinds of the epoxy reins are used, the total content of the free ions contained in the mixture thereof better satisfies the requisite described above.

The epoxy resin (1) is preferably a mixture of an epoxy resin (1-1) which is liquid in a temperature range of 0 to 50° C. and an epoxy resin (1-2) which is solid in a temperature range of 0 to 50° C. Also, the above mixture preferably becomes liquid at 0° C. to 120° C.

In the epoxy resin (1), a mixing mass proportion of the epoxy resin (1-1), which is liquid in a temperature range of 0 to 50° C., to the epoxy resin (1-2), which is solid in a temperature range of 0 to 50° C., is expressed by (1-1):(1-2) and falls preferably in a range of (95:5) to (30:70), particularly preferably (90:10) to (60:40).

The epoxy resin (1-2) which is solid in a temperature range of 0 to 50° C. in the mixture is preferably at least one resin selected from a cresol novolak type epoxy resin, a bisphenol A type epoxy resin, a bisphenol F type epoxy resin, a triphenolmethane type epoxy resin and a triphenolethane type epoxy resin, or a mixture thereof.

The epoxy resin (1) is a resin having a polystyrene-reduced mass average molecular weight falling preferably in a range of 7000 or less, more preferably 150 to 3000 and most preferably 350 to 2000, which is determined by means of a gel permeation chromatography (hereinafter referred to merely as GPC).

The polystyrene-reduced mass average molecular weight determined by means of GPC is controlled to 7000 or less, whereby a viscosity of the composition obtained by an E type viscometer after heat treatment at 80 to 100° C. for 20 minutes can be controlled to 50 to 10000 Pa.s at 80 to 100° C., and the molecular weight is preferred since the normal hot press type hot press bonding aptitude can be secured. Similarly, the polystyrene-reduced mass average molecular weight is controlled to 150 or more, whereby a cross-linking density of the resulting cured matter can be maintained high, and the reliability of heat resistant adhesion can be secured. Accordingly, such molecular weight is preferred.

A content of the epoxy resin (1) is 30 to 93 mass %, preferably 30 to 70 mass % based on the epoxy resin composition contained in the anisotropic conductive paste.

In the following epoxy resins, epoxy resins which are directly synthesized so that they satisfy the requisites described above and resins which are produced by refining or purifying conventional epoxy resins can be used. Any method can be used as the refining method as long as refining can be carried out so that an ionic conductivity of extract water obtained by contacting and mixing the resin with the same mass of purified water for 10 to 30 minutes falls in the prescribed range. It includes, for example, a water washing-solvent extraction refining method, a ultra-filtration method and a distillation refining method.

<Monofunctional Epoxy Resin>

The monofunctional epoxy resin used in the present invention includes, for example, aliphatic monoglycidyl ether compounds, alicyclic monoglycidyl ether compounds, aromatic monoglycidyl ether compounds, aliphatic monoglycidyl ester compounds, aromatic monoglycidyl ester compounds, alicyclic monoglycidyl ester compounds, nitrogen-containing monoglycidyl ether compounds, monoglycidylpropylpolysiloxane compounds and monoglycidylalkanes. It goes without saying that monofunctional epoxy resins other than these resins may be used.

(Aliphatic Monoglycidyl Ether Compound)

Included are, for example, aliphatic monoglycidyl ether compounds obtained by a reaction of polyalkylene glycol monoalkyl ethers having an alkyl group having 1 to 6 carbon atoms with epichlorohydrin and aliphatic monoglycidyl ether compounds obtained by a reaction of aliphatic alcohols with epichlorohydrin.

The polyalkylene glycol monoalkyl ethers having an alkyl group having 1 to 6 carbon atoms include ethylene glycol monoalkyl ethers, diethylene glycol monoalkyl ethers, triethylene glycol monoalkyl ethers, polyethylene glycol monoalkyl ethers, propylene glycol monoalkyl ethers, dipropylene glycol monoalkyl ethers, tripropylene glycol monoalkyl ethers and polypropylene glycol monoalkyl ethers.

Aliphatic alcohols include, for example, n-butanol, isobutanol, n-octanol, 2-ethylhexyl alcohol, dimethylolpropane monoalkyl ethers, trimethylolpropane dialkyl ethers, glycerin dialkyl ethers, dimethylolpropane monoalkyl esters, trimethylolpropane dialkyl esters and glycerin dialkyl esters.

(Alicyclic Monoglycidyl Ether Compound)

Included are, for example, alicyclic monoglycidyl ether compounds obtained by a reaction of alicyclic alcohols having a saturated cyclic alkyl group having 6 to 9 carbon atoms with epichlorohydrln.

The alicyclic alcohols used for the reaction include cyclohexanol and the like.

(Aromatic Monoglycidyl Ether Compound)

Included are, for example, aromatic monoglycidyl ether compounds obtained by a reaction of aromatic alcohols with epichlorohydrin.

The aromatic alcohols used for the reaction include phenol, methylphenol, ethylphenol, n-propylphenol, isopropylphenol, n-butylphenol, benzyl alcohol, t-butylphenol, xylenol and naphthol.

(Aliphatic or Aromatic Monoglycidyl Ester Compound)

Included are, for example, aliphatic monoglycidyl ester compounds or aromatic monoglycidyl ester compounds obtained by a reaction of aliphatic dicarboxylic acid monoalkyl esters or aromatic dicarboxylic acid monoalkyl esters with epichlorohydrin.

<Multifunctional Epoxy Resin>

A multifunctional epoxy resin is an epoxy resin having usually 2 to 6 epoxy groups on an average in a molecule, but epoxy resins having more epoxy groups can be used as well, as long as the effects of the present invention are not damaged.

The multifunctional epoxy resin includes, for example, aliphatic polyglycidyl ether compounds, aromatic polyvaglycidyl ether compounds, trisphenol type polyglycidyl ether compounds, hydroquinone type polyglycidyl ether compounds, resorcinol type polyglycidyl ether compounds, aliphatic polyglycidyl ester compounds, aromatic polyglycidyl ester compounds, aliphatic polyglycidyl etherester compounds, aromatic polyglycidyl etherester compounds, alicyclic polyglycidyl ether compounds, aliphatic polyglycidyl amine compounds, aromatic polyglycidyl amine compounds, hydantoin type polyglycidyl compounds, biphenyl type polyglycidyl compounds, novolak type polyglycidyl ether compounds and epoxidized diene polymers.

It goes without saying that multifunctional epoxy resins and modified epoxy resins other than these compounds can be used as well.

(Aliphatic Polyglycidyl Ether Compound)

Included are, for example, aliphatic polyglycidyl ether compounds obtained by a reaction of polyalkylene glycols or polyhydric alcohols with epichlorohydrin.

The polyalkylene glycols used for the reaction include, for example, ethylene glycol, diethylene glycol, triethylene glycol, polyethylene glycol, propylene glycol, dipropylene glycol, tripropylene glycol and polypropylene glycol.

The polyhydric alcohols used for the reaction include dimethylolpropane, trimethylolpropane, spiroglycol and glycerin.

(Aromatic Polyglycidyl Ether Compound)

Included are, for example, aromatic polyglycidyl ether compounds obtained by a reaction of aromatic diols with epichlorohydrin.

The aromatic diols used for the reaction include, for example, bisphenol A, bisphenol S, bisphenol F and bisphenol AD.

(Trisphenol Type Polyglycidyl Ether Compound)

Included are, for example, trisphenol type polyglycidyl ether compounds obtained by a reaction of trisphenols with epichlorohydrin.

The trisphenols used for the reaction include 4,4',4"-methylidenetrisphenol, 4,4',4"-methylidenetris(2-methylphenol), 4,4'-[(2-hydroxyphenyl)methylene]bis[2,3,6-trimethylphenol], 4,4',4"-ethylidenetrisphenol, 4,4'-[(2-hydroxyphenyl)methylene]bis[2-methylphenol], 4,4'-[(2-hydroxyphenyl)ethylene]bis[2-methylphenol], 4,4'-[(4-hydroxyphenyl)methylene]bis[2-methylphenol], 4,4'-[(4-hydroxyphenyl)ethylene]bis[2-methylphenol], 4,4'-[(2-hydroxyphenyl)methylene]bis[2,6-dimethylphenol], 4,4'-[(2-hydroxyphenyl)ethylene]bis[2,6-dimethylphenol], 4,4'-[(4-hydroxyphenyl)methylene]bis[2,6-dimethylphenol], 4,4'-[(4-hydroxyphenyl)ethylene]bis[2,6-dimethylphenol], 4,4'-[(2-hydroxyphenyl)methylene]bis[3,5-dimethylphenol], 4,4'-[(2-hydroxyphenyl)ethylene]bis[3,5-dimethylphenol], 4,4'-[(3-hydroxyphenyl)methylene]bis[2,3,6-trimethylphenol], 4,4'-[(4-hydroxyphenyl)methylene]bis[2,3,6-trimethylphenol], 4,4'-[(2-hydroxyphenyl)methylene]bis-[2-cyclohexyl-5-methylphenol], 4,4'-[(3-hydroxyphenyl)methylene]bis-[2-cyclohexyl-5-methylphenol], 4,4'-[(4-hydroxyphenyl)methylene]bis[2-cyclohexyl-5-methylphenol], 4,4'-[1-[4-[1-(4-hydroxyphenyl)-1-methylethyl]phenolethylidene]bisphenol], 4,4'-[(3,4-dihydroxyphenyl)methylene]bis[2-methylphenol], 4,4'-[(3,4-dihydroxyphenyl)methylene]bis[2,6-dimethylphenol], 4,4'-[(3,4-dihydroxyphenyl)methylene]bis[2,3,6-trimethylphenol] and 4-[bis(3-cyclohexyl-4-hydroxy-6-methylphenyl)methyl]-1,2-benzenediol.

(Hydroquinone Type Polyglycidyl Ether Compound)

Included are, for example, hydroquinone type polyglycidyl ether compounds obtained by a reaction of hydroquinone with epichlorohydrin.

(Resorcinol Type Polyglycidyl Ether Compound)

Included are, for example, resorcinol type polyglycidyl ether compounds obtained by a reaction of resorcinol with epichlorohydrin.

(Aliphatic Polyglycidyl Ester Compound)

Included are, for example, aliphatic polyglycidyl ester compounds obtained by a reaction of aliphatic dicarboxylic acids represented by adipic acid with epichlorohydrin.

(Aromatic Polyglycidyl Ester Compound)

Included are, for example, aromatic polyglycidyl ester compounds obtained by a reaction of aromatic polycarboxylic acids with epichlorohydrin.

The aromatic polycarboxylic acids used for the reaction include, for example, isophthalic acid, terephthalic acid and pyromellitic acid.

(Aliphatic or Aromatic Polyglycidyl Etherester Compound)

Included are, for example, aliphatic polyglycidyl etherester compounds or aromatic polyglycidyl etherester compounds obtained by a reaction of hydroxydicarboxylic acid compounds with epichlorohydrin.

(Alicyclic Polyglycidyl Ether Compound)

Included are, for example, alicyclic polyglycidyl ether compounds represented by dicyclopentadiene type polyglycidyl ether compounds.

(Aliphatic Polyglycidyl Amine Compound)

Included are, for example, aliphatic polyglycidyl amine compounds obtained by a reaction of aliphatic polyamines represented by ethylenediamine, diethylenetriamine and triethylenetetraamine with epichlorohydrin.

(Aromatic Polyglycidyl Amine Compound)

Included are, for example, aromatic polyglycidyl amine compounds obtained by a reaction of aromatic amines represented by diaminodiphenylmethane, aniline and metaxylilenediamine with epichlorohydrin.

(Hydantoin Type Polyglycidyl Compound)

Included are, for example, hydantoin type polyglycidyl compounds obtained by a reaction of hydantoin and derivatives thereof with epichlorohydrin.

(Novolak Type Polyglycidyl Ether Compound)

Included are, for example, novolak type polyglycidyl ether compounds obtained by a reaction of novolak resins derived from formaldehyde and aromatic alcohols represented by phenol, cresol and naphthol with epichlorohydrin.

Further, representative examples are, for example, modified phenol novolak resins obtained by a reaction of modified phenol resins which are derived from phenol and p-xylylenedichloride and in which a phenol nucleus and a paraxylene nucleus are combined with a methylene bond with epichlorohydrin.

(Epoxidized Diene Polymer)

Included are, for example, epoxidized polybutadiene and epoxidized polyisoprene.

<Modified Epoxy Resin>

Representative are addition derivative compositions comprising at least one selected from the epoxy resins described above and at least one selected from amine compounds, mercapto compounds and carboxyl compounds. Those which do not separate into phases per se and which are liquid or solid at room temperature are preferably included in the above addition derivative compositions.

Specific examples of the amine compounds, the mercapto compounds and the carboxyl compounds which are suitably used for producing the modified epoxy resins shall be given below respectively.

[Amine Compound]

Given as representative examples are, for example, aliphatic amines, alicyclic amines, aromatic amines, polyamides, polyamideamines, cyanamides, amino group-containing low molecular polysiloxanes, amino group-containing low molecular butadiene-acrylonitrile copolymers and amino group-containing low molecular acryl compounds.

(Aliphatic Amines)

They may be any ones as long as they are aliphatic amine monomers and shall not specifically be restricted. They are represented by, for example, monoethanolamine, diethanolamine, ethylenediamine, diethylenetriamine, triethylenetetraamine, hexamethylenediamine, propylenediamine, dipropylenetriamine, polyethylene glycol monoamine, polyethylene glycol diamine, polypropylene glycol monoamine and polypropylene glycol diamine.

(Alicyclic Amines)

They may be any ones as long as they are alicyclic amine monomers and shall not specifically be restricted. Representative are, for example, isophoronediamine, cyclohexyldiamine, norbornanediamine, piperidine, bisaminopropyltetraoxaspiroundecane and modified polyamines thereof.

(Aromatic Amines)

They may be any ones as long as they are aromatic amine monomers and shall not specifically be restricted. Representative are, for example, phenylenediamine, xylylenediamne, diaminodiphenylmethane, diaminodiphenylsulfone and modified polyamines thereof.

(Polyamides)

They may be any ones as long as they are polyamides and shall not specifically be restricted. They are represented by, for example, dehydrated condensed derivatives of at least one polyamine compound selected from the aliphatic amines, the alicyclic amines and the aromatic amines each described above with dicarboxylic acid compounds.

(Polyamideamines)

They may be any ones as long as they are polyamideamines and shall not specifically be restricted. They are represented by, for example, dehydrated condensed derivatives of at least one amine selected from the aliphatic amines, the alicyclic amines and the aromatic amines each described above with dicarboxylic acid compounds or aminocarboxylic acid compounds.

(Cyanamides)

They may be any ones as long as they are cyanamides and shall not specifically be restricted. They are represented by, for example, dicyanediamide.

(Amino Group-containing Low Molecular Polysiloxanes)

They may be any ones as long as they are amino group-containing low molecular polysiloxanes and shall not specifically be restricted. They are represented by, for example, polysiloxanes having an amino group at both ends and having an amine equivalent of 2000 or less.

(Amino Group-containing Low Molecular Butadiene-acrylonitrile Copolymers)

They may be any ones as long as they are amino group-containing low molecular butadiene-acrylonitrile copolymers and shall not specifically be restricted. They are represented by, for example, butadiene-acrylonitrile copolymers having an amino group at both ends and having an amine equivalent of 2000 or less and an acrylonitrile monomer-reduced content of 16 to 30 mass %.

(Amino Group-containing Low Molecular Acryl Compounds)

They may be any ones as long as they are amino group-containing low molecular acryl compounds and shall not specifically be restricted. They are represented by, for example, polyamino group-containing acryl compounds having an amine equivalent of 2000 or less and an SP value (solubility parameter) of 8.5 to 10 which is a barometer of affinity.

[Mercapto Compound]

It may be any one as long as it is a mercapto compound and shall not specifically be restricted. Given as examples are, for example, MR-6 and MR-7 which are products manufactured by Mitsui Chemicals Inc., and mercapto polysiloxanes having a mercapto group at both ends and having an amine equivalent of 2000 or less.

[Carboxyl Compound]

It may be any one as long as it is a carboxylic acid monomer and shall not specifically be restricted. Given as representative examples are, for example, carboxylic acid monomers having 20 or less carbon atoms represented by maleic acid, maleic acid anhydride, itaconic acid, adipic acid, trimellitic acid, trimellitic acid anhydride, phthalic acid, phthalic acid anhydride, tetrahydrophthalic acid, tetrahydrophthalic acid anhydride, himic acid, nadic acid anhydride and glutaric acid anhydride, polyesters having an acid group at an end derived from them and known dihydroxy compounds.

Another examples thereof include polysiloxanes, butadiene-acrylonitrile copolymers and low molecular acryl compounds each of which has a carboxyl group at both ends and has an acid value of 5 to 100 mg KOH/g.

In the anisotropic conductive paste of the present invention, the epoxy resin (1) used has preferably a viscosity by an E type viscometer of not less than 0.3 Pa.s at 80° C. It falls more preferably in a range of 1 Pa.s or more, particularly preferably 5 to 1000 Pa.s. If the epoxy resin (1) has a viscosity by an E type viscometer of more than 0.3 Pa.s at 80° C., the normal hot press aptitude of the anisotropic conductive paste is elevated.

(2) Rubber-like polymer fine particle having a softening point of 0° C. or lower and a primary particle diameter of 5 μm or less:

In the anisotropic conductive paste of the present invention, the rubber-like polymer fine particle (2) which has a softening point of 0° C. or lower in terms of a softening point determined by means of a torsional braid analyzer (hereinafter referred to merely as TBA) called a torsional pendulum method and which has an average primary particle diameter of 5 μm or less determined by electron microscope observation (hereinafter referred to merely as the rubber-like polymer fine particle) is contained in a proportion of 1 to 15 mass % based on the epoxy resin contained in the anisotropic conductive paste.

The rubber-like polymer fine particle has more preferably an average primary particle diameter of 0.01 to 5 μm, further preferably 0.01 to 3 μm and particularly preferably 0.05 to 2 μm.

The rubber-like polymer fine particle is used in a proportion of 1 mass % or more in the epoxy resin composition contained in the anisotropic conductive paste of the present invention, whereby a relaxation effect on a residual distortion in the electronic circuit board produced is derived, and as a result, the adhesion reliability can be raised. Accordingly, such proportion is preferred. Further, the content is preferably 15 mass % or less, whereby the heat resistant rigidity necessary to the cured matter is preferably secured. It falls more preferably in a range of 3 to 12.5 mass %. In particular, the rubber-like polymer fine particle (2) accounts more preferably for 5 to 10 mass % in terms of a proportion based on the epoxy resin composition.

Also, the softening point of the rubber-like polymer fine particle (2) is controlled to 0° C. or lower, whereby the adhesion reliability tends to be raised more at a low temperature, and therefore the softening point is preferred.

Further, the primary particle diameter of the rubber-like polymer fine particle (2) is controlled to 5 μm or less, whereby the vertical conduction between the electrodes can surely be elevated, and therefore such diameter is preferred.

The preferred rubber-like polymer fine particle (2) includes a silicone rubber fine particle and/or an acryl rubber fine particle or a polyolefin rubber fine particle each having a softening point of −30° C. or lower and a primary particle diameter of 0.01 to 3 μm, and the rubber-like polymer fine particle is more preferably a cross-linking rubber particle.

Any rubber-like polymers can suitably be selected and used for these rubber-like polymer fine particles (2) as long as they have a softening point of 0° C. or lower. Given as examples are, for example, rubber-like polymers of an acryl rubber base, rubber-like polymers of a silicone rubber base, rubber-like polymers of a conjugated diene rubber base, rubber-like polymers of an olefin rubber base, rubber-like polymers of a polyester rubber base, rubber-like polymers of a urethane rubber base, composite rubber and rubber-like polymers having a functional group reacting with an epoxy group. In particular, these rubber-like polymers have preferably a functional group reacting with an epoxy group.

At least one selected from these rubber-like polymers can be used for the anisotropic conductive paste of the present invention.

Specific examples of the rubber-like polymer fine particle shall be shown below.

<Rubber-like Polymer Fine Particle of an Acryl Rubber Base>

Specific examples of the rubber-like polymer fine particle of an acryl rubber base include, for example, a method using particles obtained by drying a core/shell type emulsion in which a core part comprises acryl rubber, a method using in the form of a resin composition obtained by subjecting an acryl base monomer to non-aqueous dispersion polymerization in an epoxy resin and a method using in the form of a resin composition obtained by preparing separately a solution of an acryl rubber polymer into which a functional group reacting with an epoxy group is introduced and then pouring or dropwise adding it into an epoxy resin to mechanically mix, followed by removing the solvent from the solution or grafting the acryl rubber to the epoxy resin to stably disperse acryl rubber fine particles in the epoxy resin.

<Rubber-like Polymer Fine Particle of a Silicone Rubber Base>

Specific examples of the rubber-like polymer fine particle of a silicone rubber base shall not specifically be restricted and include, for example, a method using powdery silicone rubber fine particles, a method using in the form of a resin composition obtained by introducing a double bond into an epoxy resin, reacting the epoxy resin with a silicone macro monomer having an acrylate group at a single end which is capable of reacting with the double bond and then charging vinyl silicone and hydrogen silicone into the reaction product to dispersion polymerize and a method using in the form of a resin composition obtained by reacting a reactive silicone oil in which a functional group capable of reacting with an epoxy group is introduced into both ends thereof and which has a molecular weight of 10,000 to 300,000. Further, other silicone rubber-like polymers can be used as well.

<Rubber-like Polymer Fine Particle of a Conjugated Diene Rubber Base>

Specific examples of the rubber-like polymer fine particle of a conjugated diene rubber base include, for example, conjugated diene rubber-like polymer fine particles obtained by polymerizing or copolymerizing monomers such as 1,3-butadiene, 1,3-pentadiene, isoprene, 1,3-hexadiene and chloroprene. They shall not specifically be restricted, and commercial products can be used as they are.

More specific examples of the conjugated diene rubber include a copolymer of butadiene with acrylonitrile, a butadiene-acrylonitrile copolymer having a carboxyl group at an end and a butadiene-acrylonitrile copolymer having an amino group at an end.

<Rubber-like Polymer Fine Particle of an Olefin Rubber Base>

Specific examples of the rubber-like polymer fine particle of an olefin rubber base include, for example, fine particles comprising amorphous homopolymers of ethylene, propylene, 1-butene, 2-butene and isobutene, or copolymers or terpolymers thereof with other copolymerizable monomers, or compositions thereof. A good example is a method using in the form of a resin composition obtained by subjecting a product commercially available in the form of an olefin rubber latex to dehydrating treatment in an epoxy resin to disperse and stabilize the olefin rubber in the epoxy resin.

<Rubber-like Polymer Fine Particle of a Polyester Rubber Base>

The rubber-like polymer fine particle of a polyester rubber base is a fine particle comprising a rubber-like polymer having a polyester bond in a polymer skeleton and shall not specifically be restricted.

Specific examples of the polyester rubber include, for example, low softening point polyester rubbers derived from at least one diol component selected from liquid polysiloxanediol, liquid polyolefindiol, polypropylene glycol and polybutylene glycol, if necessary, in the presence of triol or a polyhydric alcohol compound which has more hydroxyl groups than triol and at least one dibasic acid selected from adipic acid, maleic acid, succinic acid and phthalic acid, low softening point polyester rubbers prepared by substituting acid anhydrides for the dibasic acids described above and low softening point polyester rubbers derived from hydroxypolycarboxylic acids and the like.

<Rubber-like Polymer Fine Particle of a Urethane Rubber Base>

The rubber-like polymer fine particle of a urethane rubber base is a fine particle comprising a rubber-like polymer having a urethane bond and/or a urea bond in a rubber-like polymer skeleton and shall not specifically be restricted.

Specific examples of the urethane rubber include, for example, rubber-like polyurethanes obtained by reacting at least one diol component selected from liquid polysiloxanediol, liquid polyolefindiol, polypropylene glycol and polybutylene glycol, if necessary, in the presence of triol or a polyhydric alcohol compound which has more hydroxy groups than triol with a diisocyanate compound represented by hexamethylenediisocyanate, isophoronediisocyanate, tolylenediisocyanate, diphenylmethanediisocyanate and norbornanediisocyanate, and rubber-like polyurethanes obtained by reacting at least one long chain diamine component selected from liquid polysiloxanediamine (the amino group-containing low molecular polysiloxane described above), liquid polyolefindiamine and polypropylene glycoldiamine, if necessary, in the presence of triamine or a polyamine compound which has more amino groups than triamine with a diisocyanate compound represented by hexamethylenediisocyanate, isophoronediisocyanate, tolylenediisocyanate, diphenylmethanediisocyanate and norbornanediisocyanate.

<Composite Rubber Particle>

Given as examples of the composite rubber are, for example, fine particles comprising graft polymers and/or block polymers or core/shell polymers or composite polymers each comprising two or more kinds of the acryl base, the silicone base, the conjugated diene base, the olefin base, the polyester base and the urethane base each described above.

<Rubber-like Polymer Having a Functional Group Reacting with an Epoxy Group>

Representative examples of the rubber-like polymer having a functional group reacting with an epoxy group include, for example, particles obtained by introducing functional groups reacting with an epoxy group into rubber-like polymer of the acryl base, the silicone base, the conjugated diene base, the olefin base, the polyester base and the urethane base each described above.

The functional group reacting with an epoxy group includes, for example, a mercapto group, an amino group, an amino group, a carboxyl group, an acid anhydride group, an epoxy group and a hydroxyl group.

At least one of these functional groups is preferably introduced into the rubber-like polymer in a proportion of preferably 0.01 to 25 mass %, more preferably 0.1 to 10 mass %;

A method for introducing these functional groups shall not specifically be restricted and may be any one of introducing methods comprising a random copolymerization method, an alternate copolymerization method, a condensation polymerization method, an addition polymerization method and a core-shell polymerization method in each of which a functional group-containing monomer is polymerized with a monomer to constitute a main chain polymer, an ion adsorption-introducing method, a swelling impregnation-introducing method and a method for graft-polymerizing with a polymer forming a rubber-like polymer.

Among them, the copolymerizing and graft-polymerizing methods are preferred since necessary functional groups can efficiently be introduced into the vicinity of a rubber-like polymer fine particle surface in the smaller amount.

In this rubber-like polymer having a functional group reacting with an epoxy group, a structure originating in a monomer having a functional group reacting with an epoxy group accounts preferably for 0.1 to 25 mass % in terms of a mass proportion based on the rubber-like polymer. The anisotropic conductive paste has an adhesive property which is notably improved by controlling the content of the repetitive structure originating in the monomer having a functional group reacting with an epoxy group to 0.1 mass % or more and 25 mass % or less.

In the anisotropic conductive paste of the present invention, the rubber-like polymer fine particle (2) preferably takes the form of a particle in the epoxy resin. A method for finding that the rubber-like polymer is present in the form of a particle in the epoxy resin shall not specifically be restricted, and being suitably employed are, for example, a method in which a mixture of the epoxy resin (1) having no turbidity and the rubber-like polymer fine particles (2) is prepared and the composition is observed under an optical microscope to confirm the presence of rubber-like polymer fine particles, a method in which a required amount of a polymercaptan base curing agent or a polyamine base curing agent each of which is used at room temperature is added to the composition to obtain a cured matter and a minute cutting plane thereof is sensitized by dyeing with osmic acid to be observed under a transmission electron microscope (TEM) or a scanning electron microscope (SEM) and a method for finding by measuring a microscopic infrared absorption spectra of a micro layer of the cured matter (hereinafter referred to merely as microscopic IR measurement).

A method for judging that the rubber-like polymer fine particle (2) is present in the form of a fine particle in the anisotropic conductive paste of the present invention shall not specifically be restricted, and being suitably employed are, for example, a method in which the thermally cured matter thereof is produced and then a minute cutting plane thereof is sensitized by dyeing with osmic acid to be observed under TEM or SEM, a method for judging by observing a broken section of the cured matter obtained in the same manner under SEM and comparing it with the image of element distribution analysis, a method in which a cured matter surface is subjected to etching after provided with selectivity by a publicly known method and then observed under TEM or SEM, a method for judging by subjecting a micro layer of the cured matter to microscopic IR measurement and a method in which a micro layer of the cured matter is irradiated with a heat ray to judge kinds thereof from the generated gas components as well as particle diameters thereof.

Also, a method for determining a blending amount of the rubber-like polymer fine particles (2) contained in the anisotropic conductive paste prepared shall not specifically be restricted, and allowed to be suitably employed are, for example, a method in which an infrared absorption spectra (IR) of the anisotropic conductive paste are taken to determine the amount from the calibration curves of the absorption spectra specific to a rubber-like polymer fine particle, a method in which the kind of the rubber-like polymer fine particle specified by IR analysis is identified to determine it from a value of an elastic modulus attenuation factor [G"] in a low temperature area by TBA measurement as an index for an effect which is definitely revealed depending on the kind of the rubber-like polymer fine particle, a thermal decomposition gas chromatography method, an elemental analysis method, a method in which a rubber-like polymer fine particle-occupying volume is determined from plural SEM photographs of the cured matter to calculate the amount by specific gravity reduction and a method for determining by analysis of thermally decomposed gas components.

The rubber-like polymer fine particles (2) may or may not be grafted in advance to the epoxy resin (1) in the anisotropic conductive paste of the present invention.

(3) Thermally active potential curing agent for epoxy resin:

The thermally active potential curing agent for epoxy resin (3) used for the anisotropic conductive paste of the present invention is a compound which can allow an epoxy resin to start a curing reaction under a temperature condition of 30° C. or higher and is called a thermally active potential curing agent for epoxy resin.

The thermally active potential curing agent for epoxy resin (3) accounts preferably for 5 to 60 mass %, more preferably for 5 to 30 mass % in terms of a proportion based on the epoxy resin composition contained in the anisotropic conductive paste of the present invention. The proportion of 5 mass % or more makes the curability of the anisotropic conductive paste good and provides the anisotropic conductive paste having high reliability. In addition, the proportion controlled to 60 mass % or less can inhibit an unreacted product of the curing agent from remaining and can maintain a cross-linking density of the cured matter and high reliability of the anisotropic conductivity characteristic.

Any one can be used for the thermally active potential curing agent for epoxy resin as long as they act as a thermally active potential curing agent for epoxy resin. Included are, for example, 4,4'-diaminodiphenylsulfone, dicyandiamide and derivatives thereof, dibasic acid dihydrazide compounds, imidazole derivatives, complexes of imidazole compounds and aromatic acid anhydrides, adducts of imidazole compounds and epoxy resins or modified derivatives thereof, aromatic allyl ether compounds, addition polymers of alicyclic or aromatic diamines and esters, adducts of polyamine compounds and epoxy resins or modified derivatives thereof, adducts of amine compounds and diisocyanate compounds or modified derivatives thereof, adducts of urea or thiourea and epoxy resins, adducts of urea or thiourea and diisocyanate compounds, boron trifluoride-amine complexes, vinyl ether-blocked carboxylic acid compounds, N,N-dialkylurea derivatives, N,N-dialkylthiourea derivatives, melamine, guanamine and addition polymers of alicyclic diamines and esters. These thermally active potential curing agents for epoxy resin can be used alone or in combination of a plurality thereof.

Specific examples of these compounds shall be shown below.

<Dibasic Acid Dihydrazide Compound>

Given as examples thereof are, for example, dibasic acid dihydrazides comprising a saturated fatty acid skeleton having 6 to 20 carbon atoms represented by adipic acid dihydrazide, sebacic acid dihydrazide, azelaic acid dihydrazide, decanoic diacid dihydrazide and dodecanoic diacid dihydrazide, dibasic acid dihydrazides comprising an unsaturated fatty acid skeleton having 6 to 20 carbon atoms represented by oleic acid dihydrazide, aromatic dibasic acid dihydrazides represented by isophthalic acid dihydrazide and dihydrazides having a valinehydantoin skeleton. Particularly preferred ones include dibasic acid dihydrazides comprising a saturated fatty acid skeleton and/or an unsaturated fatty acid skeleton having 6 to 20 carbon atoms or dihydrazides having a valinehydantoin skeleton.

<Imidazole Derivative>

Included are, for example, N-cyanoethyl-2-ethyl-4-methylimidazole and 2-n-pentadecylimidazole. Further, microcapsuled products thereof are preferably included as well.

<Complex of Imidazole Compound and Aromatic Acid Anhydride>

Included are, for example, salts of 2-methylimidazole pyromellitic acid anhydride, salts of 2-methylimidazole tetrahydrophthalic acid anhydride and salts of 2-ethyl-4-methylimidazole tetrahydrophthalic acid anhydride.

<Aromatic Allyl Ether Compound>

Included are, for example, allyl ether compounds of 1,6-dinaphthol.

<Addition Polymers of Alicyclic or Aromatic Diamines and Esters>

The addition polymers of alicyclic or aromatic diamines and esters used for the thermally active potential curing agent for epoxy resin according to the present invention are obtained by subjecting one mole equivalent of the alicyclic diamines or aromatic diamines shown above to addition condensation polymerization with 0.75 to 1.2 mole equivalent of at least one selected from the group of acrylic acid alkyl esters and methacrylic acid alkyl esters each having an alkyl group having 1 to 6 carbon atoms or a mixture thereof.

<Adducts of Imidazole Compounds and Epoxy Resins or Modified Derivatives Thereof>

Any one can be used for the adduct of an imidazole compound and an epoxy resin which is used in the present invention as long as they are adducts of known imidazole compounds having active hydrogen groups and epoxy resins.

Given as specific examples of the modified derivatives of the adducts of imidazole compounds and epoxy resins is, for example, such an adduct as disclosed in Japanese Patent Publication No. 3828/1977 exhibiting a softening point of 70 to 150° C., which comprises a reaction product obtained by reacting an epoxy resin with an imidazole compound and then further reacting with a phenol novolak resin of an amount which does not exceed twice amount as much as a mass of the above epoxy resin component and in which a ratio of an epoxy group equivalent in the epoxy resin to an equivalent of the imidazole compound falls in a range of (0.8:1) to (2.2:1). Further, given as examples thereof respectively are such an adduct as disclosed in Japanese Patent Application Laid-Open No. 123200/1979, which is obtained by reacting an epoxy resin with an imidazole compound and then further reacting with a hydroxystyrene resin, such an adduct as disclosed in Japanese Patent Application Laid-Open No. 127625/1981, which is obtained by reacting an epoxy resin with an imidazole compound and further reacting with a polyalkenylphenol compound and such an adduct as disclosed in Japanese Patent Application Laid-Open No. 73567/1996, which is an adduct of an epoxy resin, a compound having a nitrogen basic group but having no primary amino group in a molecule (including an imidazole compound) and a phenol-formaldehyde resin having an average molecular weight of 2000 to 10000 reduced to polystyrene determined by GPC.

Those having a melting point of 70 to 150° C. are particularly preferably selected and used as specific examples of the modified derivatives of the adducts of imidazole compounds and epoxy resins.

<Adducts of Polyamine Compounds and Epoxy Resins>

The adducts of polyamine compounds and epoxy resins shall not specifically be restricted and are represented by adducts derived from known polyamine compounds and epoxy resins.

More specific examples thereof include, for example, such a low temperature-curable potential curing agent for epoxy resin as disclosed in Japanese Patent Application Laid-Open No. 12855/1996, which is obtained by reacting an addition reaction product of an epoxy resin and polyamine with a compound having two or more acidic hydroxyl groups. The compound having two or more acidic hydroxyl groups includes phenol resins, polyphenol resins and polycarboxylic acids.

<Adducts of Amine Compounds and Diisocyanate Compounds or Modified Derivatives Thereof>

The adducts of amine compounds and diisocyanate compounds are represented by adducts obtained by reacting known primary and secondary amine compounds with diisocyanates.

Such an adduct as disclosed in, for example, Japanese Patent Application Laid-Open No. 296525/1991, which is obtained by reacting N,N-dialkylaminoalkylamine and a cyclic amine with diisocyanate by heating can be given as an example of the modified derivative of the adduct of an amine compound and a diisocyanate compound. Further, capable of being given as an example thereof is such a potential curing agent for epoxy resin as disclosed in Japanese Patent Application Laid-Open No. 70736/1991, which is obtained by bringing a diisocyanate compound into even contact with a particle surface of powdery amine having a softening point of 60° C. or higher and a tertiary amino group.

To be more specific, [Fuji Cure FXR-1000 and FXR-1030] (brand names, products manufactured by Fuji Chemicals Ind. Co., Ltd.) are commercially available and preferred examples.

Preferred examples of the thermally active potential curing agent for epoxy resin according to the present invention include, in addition to those described above, a norbornanediamine-methyl methacrylate addition type curing agent which has already been proposed by the present inventors, and an embodiment In which they are used alone or in combination with the potential curing agents for epoxy resin described above is more preferred. The embodiment provides the paste which is excellent in a short time-curing property and storage stability and the cured matter which is excellent in flexibility and recoverability, and therefore it is a preferred specific example.

The norbornanediamine-methyl methacrylate addition type curing agent means a composition having a polystyrene-reduced mass average molecular weight falling in a range of 1,000 to 50,000 determined by GPC and a softening point of 50° C. or higher at lowest determined by TBA, which is obtained by subjecting one mole of norbornanediamine to addition/condensation polymerization with 0.8 to 1.2 mole of methyl(meth)acrylate at a temperature of lower than 200° C.

A thermally active temperature of the norbornanediamine-methyl methacrylate addition type curing agent determined by differential thermal analysis (DSC) can be low, for example, 49° C. Further, this type of curing agent is scarcely soluble in a bisphenol A type liquid epoxy resin, and can preferably be used as the potential curing agent for epoxy resin (3) according to the present invention.

In this case, the thermally active temperature is defined as being the lowest temperature at which a peak exhibiting heat generation by curing of a composition begins to be observed from the DSC chart, wherein taken is 10 mg of a composition prepared by adding and blending 20 to 50 mass % of a potential curing agent for epoxy resin to a brand name [Epomix R-140P], a liquid epoxy resin of bisphenol A type manufactured by Mitsui Chemicals Inc., and it is heated from a staring point of 20° C. at a constant rate of 1° C. per minute to obtain the DSC chart.

Particularly preferred is an embodiment in which the potential curing agent for epoxy resin (3) comprises at least one of adducts of an imidazole compound and an epoxy resin and a modified derivative thereof and adducts of urea and/or thiourea compound and an epoxy resin or a diisocyanate compound.

A method for determining a content of the thermally active potential curing agent for epoxy resin (3) contained in the anisotropic conductive paste includes preferably a method in which it is obtained from infrared absorption spectra, a method in which it is determined by functional group analysis and a method of NMR analysis for a solid.

These curing agents can be used as a curing accelerator, and in this case, they are preferably contained in the epoxy resin in a proportion of 5 mass % or less. Any one may be used as the curing accelerator as long as they are substances which can provide a low temperature curing property by using in combination with the potential curing agent for epoxy resin (3) described above.

Given as examples thereof are, for example, urea derivatives represented by 3-p-chlorophenyl-1,1-dimethylurea, imidazole compounds or salts thereof, aliphatic amines or salts thereof, alicyclic amines or salts thereof, aromatic amine compounds or salts thereof, polycarboxylic acids or salts thereof, liquid polyamides and liquid polyamineamides.

It is recommended to select ones which have a low activity at a low temperature and are excellent in storage stability from those described above, and urea derivatives are particularly recommended from such point of view.

(4) High softening point-polymer fine particle having a softening point of 50° C. or higher and a primary particle diameter of 2 μm or less (hereinafter referred to merely as a high softening point-polymer fine particle):

The high softening point-polymer fine particle (4) is preferably added in a range of 1 to 20 mass % in terms of a proportion based on the epoxy resin composition which is a component in the anisotropic conductive paste of the present invention.

Use of 1 mass % or more makes it possible to surely prepare an anisotropic conductive circuit without causing resin leaking or bleeding in a primary adhesion step by a normal hot press. On the other hand, use of 20 mass % or less makes it possible to sufficiently secure satisfactory wettability and adhesion workability on a circuit board. Accordingly, such a range is preferred.

This high softening point-polymer fine particle (4) is a high softening point-polymer fine particle having a softening point of 50° C. or higher in terms of a softening point determined by TBA and an average particle diameter of a primary particle of 2 μm or less determined by observation under an electron microscope.

An anisotropic conductivity can more surely be revealed by controlling an average particle diameter of a primary particle of the high softening point-polymer fine particle (4) to 2 μm or less. The average particle diameter of the primary particle falls more preferably in a range of 0.01 to 1 μm, further more preferably 0.2 to 0.5 μm.

The high softening point-polymer fine particle (4) of either a cross-linking type or a non-cross-linking type can be used, and the cross-linking type is more preferred. In particular, the high softening point-polymer micro particle having a micro cross-linking structure is most preferred.

The high softening point-polymer fine particle having a micro cross-linking structure can be produced by controlling a cross-linkable monomer to a range of 0.1 to 50 mass %, preferably 1 to 10 mass % and most preferably 1 to 3 mass % based on the whole monomers for producing the polymer.

A gel content is one of indices for a degree of the micro cross-linking. This is an index determined from the following equation, wherein 10 g of the high softening point-polymer fine particle is dispersed in 50 g of a methylcarbitol solvent and stirred for one hour at 25° C., and then it is filtered to determine a quantity of the filtrate and a polymer content (dissolved amount) in the filtrate:

gel content (%)=(dissolved amount/10 g)×100

This gel content index falls preferably in a range of 0 to 50%, more preferably 0 to 5%.

The high softening point-polymer fine particle falls preferably in a range of 9 to 11, more preferably 9.3 to 10.5 in terms of an SP value (solubility parameter), which is an index for showing an affinity calculated from a chemical structural formula.

Given as specific examples of the high softening point-polymer fine particle (4) are, for example, polymers having micro cross-linking polymethyl methacrylate as the main component which is obtained by copolymerizing 0.1 to 50 mass % of cross-linkable monomers and polymethyl methacrylate polymers having an ionomer structure falling in a range of 0.1 to 50 mass %.

The high softening point-polymer fine particle has preferably a softening point of 60 to 150° C. and a primary particle diameter falling in a range of 0.01 to 2 μm.

In this high softening point-polymer fine particle, one kind of a functional group such as an epoxy group, an amino group, an imino group, a mercapto group and a carboxyl group is more preferably introduced onto a particle surface thereof.

In the anisotropic conductive paste of the present invention, the rubber-like polymer fine particle (2) and the high softening point-polymer fine particle (4) may be combined in advance, and included is, for example, an embodiment in which the rubber-like polymer fine particle (2) forms a core phase and the high softening point-polymer fine particle (4) forms a shell phase, a so-called core/shell type composite fine particle of (2) and (4) (A). Also, in contrast with this, allowed to be used is a core/shell type composite fine particle (B) in which the high softening point-polymer fine particle (4) forms a core phase and the rubber-like polymer fine particle (2) forms a shell phase. Preferred is the former embodiment in which the core/shell type composite fine particle (A) is used.

In the core/shell type composite fine particle (A) involving the rubber-like polymer fine particle (2) as the core phase, a mass ratio of core:shell falls preferably in a range of (1:0.3) to (1:2).

For example, a brand name [Zeon F-351], a product manufactured by Nippon Zeon Co., Ltd. can readily be available as a specific example of this core/shell type high softening point-polymer fine particle (A) and can preferably be used.

A method for determining a proportion of the high softening point-polymer fine particle (4) contained in the anisotropic conductive paste shall not specifically be restricted and includes, for example, a thermal decomposition gas chromatography method and a nuclear magnetic resonance spectrum (NMR) method.

(5) Conductive particle having an average particle diameter of 5 to 15 μm, a maximum particle diameter of 20 μm or less and a minimum particle diameter of 0.1 μm or more (hereinafter referred to merely as a conductive particle):

The anisotropic conductive paste of the present invention comprises 93 to 97 volume % of the epoxy resin composition comprising the components (1) to (4) described above and 3 to 7 volume % of the conductive particle (5).

Use of 3 volume % or more of the conductive particle (5) makes it possible to secure a certainty of vertical conduction. On the other hand, use of 7 volume % or less thereof improves securely an insulating characteristic between both horizontal (left and right) electrodes and therefore such a range is preferred.

The kind of the conductive particle shall not specifically be restricted, and specific examples thereof shall be shown below.

Capable of being used are, for example, noble metal particles, noble metal alloy particles, base metal particles, base metal alloy particles, other metal-coated type organic particles and metal-coated type insulating inorganic particles.

(Noble Metal)

For example, gold, silver and platinum can be given as examples thereof.

(Noble Metal Alloy)

Given as examples thereof are, for example, silver-copper alloy, gold-copper alloy, gold-silver alloy, platinum-silver alloy, gold-platinum alloy, gold-nickel alloy and silver-nickel alloy.

(Base Metal)

For example, copper, nickel, tin and tungsten can be given as examples thereof.

(Base Metal Alloy)

For example, copper-nickel alloy, copper-tin alloy and solder can be given as examples thereof.

(Metal-coated Type Organic Particles)

Representative examples thereof include, for example, particles obtained by forming the conductive metal films described above on particles of organic polymers represented by polystyrene and polymethyl methacrylate. [Micropearl AU series], a brand name, manufactured by Sekisui Fine Chemical Co., Ltd. is known as a commercial product and can preferably be used for the present invention.
(Metal-coated Type Insulating Inorganic Particles)

Representative examples thereof include, for example, particles obtained by forming the conductive metal films described above on high insulating inorganic particles represented by mica and glass beads.

From a viewpoint that the conductive particle is liable to secure dispersion stability, preferred is an embodiment in which the metal-coated type organic particles account for 3 to 7 volume % in terms of a proportion based on the anisotropic conductive paste. In particular, most preferred in the present invention is the conductive particle (5) whose core is organic polymer and coated with a metal layer of at least one selected from gold, silver, gold-copper alloy, silver-copper alloy, nickel and alloys thereof.

This conductive particle has preferably an average particle diameter falling in the range described above. In particular, the average particle diameter controlled to 1 μm or more makes it possible to reveal better conduction characteristics. On the other hand, the particle diameter which is controlled on the average to 15 μm or less and at the maximum to 20 μm or less makes it possible to substantially prevent conduction between parallel arranged electrodes.

In the anisotropic conductive paste of the present invention, 0.1 to 10 mass % of the inorganic filler (6) may be added, if necessary, to the anisotropic conductive paste comprising the components (1) to (5). The inorganic filler (6) which can be used in this case shall be described below.
(6) Inorganic Filler:

The inorganic filler (6) which can be used, if necessary, in the anisotropic conductive paste of the present invention may be any one as long as they can usually be used as an inorganic filler in the electronic material field.

To be specific, they include, for example, calcium carbonate, magnesium carbonate, barium sulfate, magnesium sulfate, aluminum silicate, zirconium silicate, iron oxide, titanium oxide, aluminum oxide (alumina), zinc oxide, silicon oxide, potassium titanate, kaolin, talc, asbestos powder, quartz powder, mica and glass fiber.

A total content of alkali metals which is determined by an atomic absorption spectrometry of the inorganic filler decomposition product under a wet condition is controlled preferably to 50 ppm or less, more preferably 30 ppm or less and particularly preferably 15 ppm or less.

A refining method for controlling the total content of alkali metals to 50 ppm or less shall not specifically be restricted, and the refining may be carried out by a known method such as an ion exchange method for an aqueous solution of the raw materials.

Also, the inorganic filler (6) has preferably a particle diameter falling in a range of 5 μm or less of a value at 99 mass % on a weight integration curve, which is determined by means of a laser particle size-measuring instrument using laser having a wavelength of 632.8 nm, and it has more preferably a weight average particle diameter falling in a range of 0.005 to 1 μm, which is shown by a value at 50 mass % on the weight integration curve.

In general, use of the inorganic filler having a particle diameter of 5 μm or less of a value at 99 mass % on the weight integration curve makes the vertical conduction good and can inhibit or substantially prevent resin leaking from being caused.

In the anisotropic conductive paste of the present invention, the inorganic filler (6) accounts preferably for 1 to 10 mass % in terms of a content thereof. It falls more preferably in a range of 1 to 7.5 mass %, particularly preferably 1 to 5 mass %. The content of 1 mass % or more elevates a coated form-holding property in screen printing or dispenser coating. On the other hand, the content controlled to 10 mass % or less can secure a property of an anisotropic conductivity in connecting the vertical electrodes.

The inorganic filler (6), though not specifically restricted, is preferably used after modified in advance by grafting with an epoxy resin (1) or a silane coupling agent (7).

In modification by grafting, a part or the whole of the inorganic filler (6) may be modified by grafting. In this case, the grafting rate is shown by a mass increasing rate determined by a repetitive solvent-washing method, and usually either or both of the epoxy resin (1) and the silane coupling agent (7) of 1 to 50 mass parts per 100 mass parts of the inorganic filler (6) are preferably chemically bonded.

A method for measuring the content of the inorganic filler (6) shall not specifically be restricted and may be an optional method such as a method for determining by elemental analysis, a method for determining by fluorescent X-ray analysis and a method for determining by a heat decomposition residual amount.

In the anisotropic conductive paste of the present Invention, 0.1 to 5 mass % of the silane coupling agent (7) is preferably further added to the anisotropic conductive paste comprising the components (1) to (5) or (1) to (6).

The silane coupling agent (7) which can be used in this case shall be described below.
(7) Silane coupling agent:

The silane coupling agent (7) which can be used, if necessary, in the anisotropic conductive paste of the present invention may be any one as long as they can be used as a silane coupling agent and shall not specifically be restricted. Trialkoxysilane compounds and methyldialkoxysilane compounds can be given as preferred examples thereof.

Given as specific examples thereof are
γ-glycidoxypropylmethyldimethoxysilane,
γ-glycidoxypropyltrimethoxysilane,
γ-glycidoxypropylmethyldiethoxysilane,
γ-glycidoxypropyltriethoxysilane,
γ-aminopropylmethyldimethoxysilane,
γ-aminopropyltrimethoxysilane,
γ-aminopropylmethyldiethoxysilane,
γ-aminopropyltriethoxysilane, N-aminoethyl-γ-aminopropylmethyldimethyldimethoxysilane,
N-aminoethyl-γ-aminopropyltrimethoxysilane,
N-aminoethyl-γ-aminopropyltriethoxysilane, N-phenyl-γ-aminopropyltrimethoxysilane, N-phenyl-γ-aminopropyltriethoxysilane, N-phenyl-γ-aminopropylmethyldimethoxysilane, N-phenyl-γ-aminopropylmethyldiethoxysilane,
γ-mercaptopropylmethyldimethoxysilane,
γ-mercaptopropyltriethoxysilane,
γ-mercaptopropylmethyldiethoxysilane,
γ-mercaptopropyltrimethoxysilane,
γ-isocyanatopropylmethyldiethoxysilane and
γ-isocyanatopropyltriethoxysilane. Among them, glycidylsilane is particularly preferred.

The silane coupling agent (7) is preferably used in a proportion falling in the range described above, and use of 1 mass % or more based on the anisotropic conductive paste can expect the adhesive property to a glass board to be improved. On the other hand, the use in the proportion controlled to 5 mass % or less makes it possible to secure a balance between the non-bleeding property and the adhesion reliability and therefore is preferred. It is used more preferably in a proportion of 0.5 to 3 mass %.

A method for determining a proportion of the silane coupling agent (7) contained in the anisotropic conductive paste shall not specifically be restricted and includes, for example, a thermal decomposition gas chromatography method, a nuclear magnetic resonance spectrum (NMR) method and a method in which a gas volume generated by hydrolysis is determined.

In the anisotropic conductive paste of the present invention, 1 to 25 mass % of a solvent (8) which is compatible with an epoxy resin and inactive to an epoxy group may be used in the anisotropic conductive paste comprising the components (1) to (5) or (1) to (7). Use of 1 mass % or more thereof elevates the wettability to an adherend and therefore is preferred. On the other hand, use of 25 mass % or less secures the coating workability and therefore is preferred.

(8) Solvent:

The solvent (8) shall not specifically be restricted, and any one of high boiling solvents having a boiling point falling in a range of 150 to 220° C. is preferably used. The solvents may be used alone or in combination of a plurality thereof.

Specific examples of the preferred solvent include, for example, ketone solvents such as cyclohexanone, ether solvents and acetate solvents.

More specific examples of the ether solvents include ethylene glycol monomethyl ether, ethylene glycol monoethyl ether, ethylene glycol monopropyl ether, ethylene glycol monobutyl ether, ethylene glycol monophenyl ether, ethylene glycol dimethyl ether, ethylene glycol diethyl ether, ethylene glycol dipropyl ether, ethylene glycol dibutyl ether, ethylene glycol diphenyl ether, diethylene glycol monomethyl ether, diethylene glycol monoethyl ether, diethylene glycol monopropyl ether, diethylene glycol monobutyl ether, diethylene glycol monophenyl ether, diethylene glycol dimethyl ether, diethylene glycol diethyl ether, diethylene glycol dipropyl ether, diethylene glycol dibutyl ether and diethylene glycol diphenyl ether.

The acetate solvents are represented, for example, by ethylene glycol monoacetate, ethylene glycol monomethyl ether acetate, ethylene glycol monoethyl ether acetate, ethylene glycol monopropyl ether acetate, ethylene glycol monobutyl ether acetate, ethylene glycol monophenyl ether acetate, ethylene glycol diacetate, diethylene glycol monomethyl acetate, diethylene glycol monoethyl acetate, diethylene glycol monobutyl ether acetate and diethylene glycol diacetate.

The particularly preferred solvent (8) is at least one selected from ethylene glycol monobutyl ether, ethylene glycol monomethyl ether acetate, diethylene glycol dimethyl ether, propylene glycol monomethyl ether, propylene glycol monomethyl ether acetate, propylene glycol monoethyl ether acetate and propylene glycol diacetate.

(9) Other additives:

In the anisotropic conductive paste of the present invention, a leveling agent, a pigment, a dye, a plasticizer and a defoaming agent can further be used, if necessary.

Production Process for the Anisotropic Conductive Paste

The anisotropic conductive paste of the present invention can be prepared by suitably adding and mixing:

(1) the epoxy resin having 1.2 or more epoxy groups on an average in a molecule,
(2) the rubber-like polymer fine particle having a softening point of 0° C. or lower and a primary particle average diameter of 5 µm or less,
(3) the thermally active potential curing agent for epoxy resin, (4) the high softening point-polymer fine particle having a softening point of 50° C. or higher and a primary particle average diameter of 2 µm or less,
(5) the conductive particle, and if necessary
(6) the inorganic filler,
(7) the silane coupling agent,
(8) the solvent, and
(9) other additives and shall not specifically be restricted.

They can be mixed by means of a known kneading machine such as a double arm stirrer, a roll mixer, a twin screw extruder and a ball mill, and the paste is subjected to vacuum degassing treatment, finally charged into a glass bottle or a plastic vessel and tightly sealed, stored and transported.

Physical Properties of the Anisotropic Conductive Paste

The anisotropic conductive paste of the present invention have preferably the characteristics of (a) to (f) described above and the following characteristics.

For example, a maximum exothermic peak temperature determined from a thermogram obtained by differential scanning calorimetry (DSC) in which 10 mg of the anisotropic conductive paste is heated at a constant rate of 5° C./minute in an inert gas environment is preferably 80 to 180° C. The peak temperature controlled to 80° C. or higher makes it possible to secure the quick curing property at a low temperature in bonding by a normal hot press. On the other hand, the peak temperature is controlled to 180° C. or lower so that the bonding conditions are avoided from becoming severe more than needed and therefore is preferred.

In particular, the anisotropic conductive paste of the present invention is preferably a single liquid type epoxy resin composition, and the exothermic initiation temperature determined from a thermogram obtained by differential scanning calorimetry (DSC) in which 10 mg of the anisotropic conductive paste is heated at a constant rate of 5° C./minute in an inert gas environment is preferably 30 to 130° C. The initiation temperature controlled to 30° C. or higher makes it possible to secure the viscosity stability in handling the anisotropic conductive paste of the present invention in the vicinity of room temperature. On the other hand, the initiation temperature is controlled to 130° C. or lower so that the quick curing property at a low temperature in bonding by a normal hot press and therefore is preferred.

The viscosity of the anisotropic conductive paste before curing shall not specifically be restricted, and the viscosity at 25° C. determined by an E type viscometer falls preferably in a range of 1 to 1000 Pa.s, more preferably 5 to 500 Pa.s and most preferably 10 to 200 Pa.s. The anisotropic conductive paste of the present invention is controlled in advance to a viscosity in this range by heating and aging, and then coated or produced.

The thixotropic index represented by, for example, (viscosity value at 1 rpm)/(viscosity value at 10 rpm)

which are obtained by using the same rotor number of an E type viscometer, though not specifically restricted, falls preferably in a range of 1 to 15.

Method for Forming an Electric Connection Circuit of a Liquid Crystal Display Board with a Semiconductor IC and/or an IC-loaded Circuit Board (Hereinafter Referred to Merely as a Connection Circuit-forming Method)

The method for forming an electric connection circuit of a liquid crystal display board with a semiconductor IC and/or an IC-loaded circuit board according to the present invention is a method characterized by dispenser-coating the anisotropic conductive paste of the present invention on electric connection parts of the liquid crystal display board with the semiconductor IC and/or the IC-loaded circuit board and pressing them by means of a normal hot press of a temperature lower than 250° C. for short time to bond and fix them making use of a thermal curing reaction of the above anisotropic conductive paste to thereby form an electric conductive circuit capable of vertical conduction.

The vertical conduction used in the present invention means that in oppositely disposed electrodes, one electrode face is present in a direction vertical to the other electrode face and conduction is made between the electrodes present in a position where a distance between the electrode faces is shortest, that is, conduction is made between the electrodes in the position that one electrode face is present in the inside of the projection of the other electrode which is is projected downward vertically.

With respect to specific examples of the connection circuit-forming method of the present invention, in dispenser-coating, the whole dispensers may be preheated under a temperature of 20 to 50° C., and coating may be carried out on a needed part by controlling a coating drive with a computer or manually. In heating, bonding and fixing by means of a normal hot press, though not specifically restricted, a temperature of the normal hot press plate falls in a range of 100° C. or higher and lower than 250° C., preferably 110 to 220° C. and more preferably 120 to 200° C.

A pressing pressure in hot bonding by means of a normal hot press is controlled preferably to about 0.01 to 5 MPa/cm$^2$, and in order to make it possible to evenly apply heat and pressure on connection parts of an adherend, for example, pressing is preferably carried out via a rubber mat disposed between the adherend face and the press face.

A method for forming a vertical conduction circuit between vertical substrates in a liquid crystal cell can preferably be employed as the connection circuit-forming method of the present invention, and given as a preferred embodiment is a method for forming a vertical conduction circuit between vertical substrates in a liquid crystal cell characterized by that the anisotropic conductive paste of the present invention is printed or dispenser-coated on a part doubling electric connection and sealing of the cell on a glass-made or plastic-made substrate for a liquid crystal cell and precured at 80 to 100° C.; then, the bonding position is adjusted in a pair with one more non-coated substrate; and the paired substrates are subjected to hot press treatment at 110 to 200° C. of a normal hot press temperature to connect and fix the above paired substrates in a homogeneous thickness falling in a range of 3 to 7 $\mu$m.

In this case, precuring is required in advance in order to bond and seal the cell with completely curing the anisotropic conductive paste containing a solvent. The precuring conditions shall not specifically be restricted. A drying temperature at which the solvent contained can preferably be removed by at least 95 mass %, and which is not higher than a thermally active temperature of the potential curing agent for epoxy resin contained is preferably selected.

General precuring conditions are a temperature falling in a range of 80 to 100° C. and a drying time falling in a range of 5 to 20 minutes. The drying time is preferably shortened as the temperature is elevated.

It is a matter of course in the preceding substrates for liquid crystal cells that used is a so-called liquid crystal cell-constituting glass substrate or plastic substrate on which provided on needed parts are a transparent electrode represented by indium oxide, an alignment film represented by polyimide and in addition thereto, an inorganic ion-shielding film and the like.

The normal hot press includes a single layer hot press and a multistage hot press and may be either one.

A method for coating the anisotropic conductive paste on a substrate to be electrically connected shall not specifically be restricted and includes, for example, a screen printing coating method and a dispenser coating method. After coating, predrying may be carried out, if necessary.

Particularly in hot press bonding of the substrates by means of a normal single layer hot press, a condition under which a temporary adhesive property can be secured shall not specifically be restricted. Preferably, after connected at 200 to 250° C. for 5 seconds to about one minute, the pressure is reduced to take out the substrates, and subsequently the paste is completely cured in a heating oven of 100 to 200° C., whereby connection between the substrates can be carried out through such two-stage or plural heating steps and curing steps.

In this case, the normal single layer hot press means a hot press machine having a specification to carry out connection set by set.

EXAMPLES

The present invention shall be explained below in details with reference to representative examples, but the present invention shall not be restricted thereto.

Percentage and part in the examples mean mass % and mass part (weight part) respectively. The kinds (abbreviation codes) of raw materials used in the examples are as follows.
Test Methods
(Storage Stability Test)

A polyethylene-made vessel is charged with 100 parts of either the anisotropic conductive paste or the epoxy resin composition which is a base and is not compounded with conductive particles and tightly sealed. Then, the viscosity value after 30 days passed at −10° C. is shown by a change rate, wherein the viscosity value at 20° C. at the time of sealing is set at 100:
○: change rate is less than 10%, and storage stability is good
Δ: change rate is 11 to 50%, and storage stability is a little problematic
×: change rate exceeds 50%, and storage stability is inferior
(Coating Workability Test)

The anisotropic conductive paste stored in a sealed polyethylene-made vessel at the freezing point or lower is taken out and turned to 25° C. of room temperature in 2 hours. The viscosity value at 25° C. at that time is set at 100, and the viscosity value after left standing at 25° C. for 12 hours is shown by a change rate:
○: change rate is less than 15%, and coating workability is good
Δ: change rate is 16 to 50%, coating workability is a little inferior
×: change rate exceeds 50%, and coating workability aptitude is markedly inferior
(Viscosity Characteristic of B Stage-reduced Composition at 80 to 120° C. by an E Type Viscometer)

The anisotropic conductive pastes prepared in the respective examples are coated on a smooth release file in a thickness of 10 to 50 $\mu$m and subjected to heat treatment at 80° C. for 20 minutes to obtain B stage-reduced compositions, and 0.6 part thereof is quickly sampled. The temperature is elevated from 80° C. to 120° C. at a constant rate of 1° C./2 minutes in determining viscosities by means of an E type viscometer to obtain a temperature-viscosity curve. The minimum viscosity (called as well a bottom viscosity) in a range of 80 to 100° C. is determined from the above temperature-viscosity curve:
×(-): value is less than 50 Pa.s
Δ: 50 to 100 Pa.s
○: 101 to 500 Pa.s
◎: 501 to 10000 Pa.s
×: value exceeds 10000 Pa.s (Linear Expansion Coefficient of Cured Matter)

The anisotropic conductive pastes prepared in the respective examples are coated on a smooth release film in a thickness of 70 to 120 μm and subjected to heat treatment at 80° C. for 20 minutes, and then it is further subjected to hot curing at 150° C. for 90 minutes to obtain a cured film. A small piece (15 mm square) thereof is cut out and subjected to ATM measurement with elevating the temperature from 0 up to 180° C. at a constant rate of 5° C./minute. The distortion observed from 0° C. up to 80° C. is divided by 80 to determine a linear expansion coefficient per 1° C.

(Heat Deformation Temperature of Cured Matter)

The anisotropic conductive pastes prepared in the respective examples are coated on a smooth releasing film in a thickness of 70 to 120 μm and subjected to heat treatment at 80° C. for 20 minutes, and then it is further subjected to hot curing at 150° C. for 90 minutes to obtain a cured film. A small piece (15 mm square) thereof is cut out and subjected to ATM measurement with elevating the temperature from 40 up to 180° C. at a constant rate of 5° C./minute. The inflection point of distortion is set as a heat deformation temperature (Tg) of the cured matter.

(Water Absorption Coefficient of Cured Matter)

The anisotropic conductive pastes prepared in the respective examples are coated on a smooth release film in a thickness of 70 to 120 μm and subjected to heat treatment at 80° C. for 20 minutes, and then it is further subjected to hot curing at 150° C. for 90 minutes to obtain a cured film. The cured film is cut out to a 100 mm square and dipped in boiling water for 3 hours. Then, an increment in the mass is measured to obtain the water absorption coefficient which is determined by dividing the increment by the original mass to obtain a value and multiplying it by 100. That is, it is shown by:

water absorption coefficient (%)=(increment in the mass after dipping in boiling water)/mass before test)×100

(Free Ion Concentration)

Measured is an ionic conductivity of compositions prepared by stiring 100 mass parts of the anisotropic conductive pastes prepared in the respective examples with the same mass of purified water at room temperature for 10 minutes:
◎: conductivity is 1 mS/m or less
Δ: conductivity is 1.1 to 9.9 mS/m
×: conductivity is 10 mS/m or more (Gel Time Test)

Put on a hot plate of 150° C. is 0.1 part of the anisotropic conductive paste and stirred by means of a wooden spoon to determine time consumed until stringiness disappears, and the above time is set as 150° C. gel time.

(Hot Connection Test)

A base board is a glass substrate provided with comb-like transparent ITO electrodes having an interval of 20 micron, and the anisotropic conductive paste is coated in an average thickness of 20 μm given by a dispenser so that the whole surfaces of the electrodes are covered. Then, superposed thereon is another sheet of a paired circuit board on which parallel ITO electrodes are linearly disposed at an interval of 20 micron in a position making a pair with the ITO electrodes of the base board. Then, a cell between the ITO composite boards produced via a hot press curing step under the conditions shown in the respective examples is observed under a phase contrast microscope to observe the presence of resin leaking and bubbles. Further, an insulting characteristic between different terminals of the cell and a conductivity value between the vertical electrodes are determined.

(Test of Peeling Cell by Wedge)

A wedge is driven into the cell, and an adhesive force of the anisotropic conductive paste is shown by a peeling state thereof:
◎: board is broken, and adhesive property is excellent
○: cohesive failure of paste is partly observed, and adhesive property is good
×: breakage having interfacial peeling is observed, and adhesive property is problematic (Staining by Sticking Out of Anisotropic Conductive Paste)

In the cell subjected to the connection test, a distance from an edge line in bonding of the anisotropic conductive paste is measured:
◎: resin leaking of less than 0.1 mm is generated, and no staining by sticking out is found
Δ: resin leaking of 0.2 to 1 mm is generated, and staining by sticking out is observed a little
×: resin leaking exceeding 1.1 mm is found, and staining by sticking out is notably observed The cells produced via a single layer press curing step under the conditions shown in the respective examples are observed under a magnifying glass of 20 magnifications with naked eyes to determine the presence of disturbance of the connected lines and resin leaking.

Raw Materials Used

1. Epoxy Resin (1)

Prepared as monofunctional epoxy resins are 2-ethylhexyl monoglycidyl ether (abbreviation code: 2EHG) so refined that an ionic conductivity (hereinafter referred to merely as an ionic conductivity of extract water) of extract water is 0.015 ms/m, wherein 2 EHG is subjected to exaction by bringing into contact with the same mass of purified water for one hour and t-butylphenol monoglycidyl ether (abbreviation code: t-BPMG) refined to 0.012 mS/m in terms of an ionic conductivity of extract water.

The following ones are used as polyepoxy resins having di-functionality or higher.

1,6-Hexanediol diglycidyl ether refined to 0.02 mS/m in terms of an ionic conductivity of extract water is used as a difunctional aliphatic epoxy resin.

Used as difunctional bisphenol A type epoxy resins are a brand name [EPOMIK R-140P] (average molecular weight: 370), a product manufactured by Mitsui Chemicals, Inc. and brand names [Epikote 1001] (average molecular weight: 900) and [Epikote 1004] (average molecular weight: 1400), products manufactured by Yuka Shell Co., Ltd.

Used as a difunctional bisphenol F type epoxy resin is a brand name [Epiclon 830-S] (average molecular weight: about 350 to 370), a product manufactured by Dainippon Ink and Chemicals Inc.

Used as a difunctional flexible liquid epoxy resin is a brand name [Adeka EP-4000] (average molecular weight; less than 4000), a product manufactured by Asahi Denka Kogyo K.K.

Used as a trifunctional novolak epoxy resin is a brand name [Epotote YDCN] (average molecular weight: about 870 to 1000), a product manufactured by Toto Kasei Co., Ltd.

2. Thermally Active Potential Curing Agent for Epoxy Resin (3)

A brand name [Fuji Cure FXR-1000] (abbreviation code: AD1), a product manufactured by Fuji Kasei Ind. Co., Ltd. is used as an amine adduct-1 having a thermally active temperature of 73° C. which is determined by DSC measurement.

Used is an amine adduct-2 (Cat-Z-15, manufactured by Mitsui Chemicals, Inc.) (abbreviation code: AD2) having a thermally active temperature of 59° C. which is determined by DSC measurement.

Prepared and used as a novel low temperature thermally active type potential curing agent for epoxy resin is an NBDA adduct (abbreviation code) type potential curing agent for epoxy resin having a thermally active temperature of 47° C. determined by DSC measurement, which is prepared by adding 0.98 mole of methyl methacrylate to one mole of norbornanediamine in the presence of nitrogen gas at 150° C. for 3 hours in a four neck flask to obtain an adduct solid having a melting point of 55° C. and then pulverizing it to an average particle diameter of 3 to 5 $\mu$m.

Conductive Fine Particle (5)

Used is a brand name [Micro Pearl AU-205] (average particle diameter: 5 $\mu$m, maximum particle diameter: 6.5 $\mu$m, minimum particle diameter: 4 $\mu$m), a product manufactured by Sekisui Fine Chemical Co., Ltd.

Inorganic Filler (6)

Used as an amorphous type silica-1 (Abbreviated name) is a brand name [Aerosil #200] (average primary particle size: 0.08 $\mu$m), a product manufactured by Nippon Aerosil Ind. Co., Ltd.

Used as an amorphous type silica-2 (Abbreviated name) is a brand name [MU-120] (average primary particle size: 0.07 $\mu$m), a product manufactured by Shin-etsu Chemical Co., Ltd.

Used as an amorphous type alumina (Abbreviated name) is a brand name [UA-5105], a product manufactured by Showa Denko K.K. and used as titanium oxide is a brand name [CR-EL] (average primary particle size: 1 $\mu$m), a product manufactured by Ishiwara Sangyo Kaisha Ltd.

Also, the following ones are used as grafted modified alumina.

Grafted Modified Alumina-1 (Abbreviated Name)

Prepared was γ-alumina of an amorphous type having an average particle diameter of 0.1 $\mu$m which is a value at 50% of a weight integration curve determined by a laser irradiation type particle size distribution-measuring method using laser having a wavelength of 632.8 nm and an average particle diameter of 2 $\mu$m which is a value at 99.5% of the weight integration curve. The amorphous γ-alumina of 1 kg was subjected to spraying treatment with 30.3 g of γ-glycidoxypropyltrimethoxysilane (brand name KBM403, a product manufactured by Shin-etsu Silicone Co., Ltd.) under an environment of 100° C., and it was further grafted and ripened at 80° C. for 48 hours. A sample dried after washing 5 times 10 parts of grafted modified alumina-1 with 100 parts of a toluene solvent was burned in a porcelain crucible to find that there was a mass-loss of 1.7% on heating as an organic substance, and therefore it was confirmed that about 2.4% of γ-glycidoxypropyltrimethoxysilane was grafted.

Grafted Modified Alumina-2 (Abbreviated Name)

Prepared was γ-alumina of an amorphous type having an average particle diameter of 0.1 $\mu$m which is a value at 50% of a weight integration curve determined by a laser irradiation type particle size distribution-measuring method using laser having a wavelength of 632.8 nm and an average particle diameter of 2 $\mu$m which is a value at 99.5% of the weight integration curve. The amorphous γ-alumina of 1 kg was wetted with 30.3 g of γ-glycidoxypropyl-trimethoxysilane (brand name KBM403, a product manufactured by Shin-etsu Silicone Co., Ltd.) in the presence of an acetone solvent and then dried at 80° C. in a vacuum drier, and it was further grafted and ripened at 80° C. for 48 hours under an atmospheric pressure. A sample dried after washing 5 times 10 parts of grafted modified alumina-2 with 100 parts of a toluene solvent was burned in a porcelain crucible to find that there was a mass-loss of 1.7% on heating as an organic substance, and therefore it was confirmed that about 2.5% of γ-glycidoxypropyltrimethoxysilane was grafted.

5. Silane Coupling Agent (7)

Used is γ-glycidoxypropyltrimethoxysilane (brand name KBM403, a product manufactured by Shin-etsu Silicone Co., Ltd.).

6. Rubber-like Polymer Fine Particle (2)

The respective compositions prepared in the following synthetic example 1 and synthetic example 2 are used for the rubber-like polymer fine particle (2).

Synthetic Example 1

Synthesis of Rubber-like Polymer Fine Particle (Micro Cross-linking Type Acryl Rubber Fine Particle; Abbreviated as S-1)-containing Epoxy Resin Composition (a)

A four neck flask of 2000 ml equipped with a stirrer, a gas-inlet tube, a thermometer and a cooling tube was charged with 600 g of a bisphenol F type epoxy resin (Epiclon 830S, manufactured by Dainippon Ink and Chemicals Inc.) as a difunctional epoxy resin, 12 g of acrylic acid, 1 g of dimethylethanolamine and 50 g of toluene, and they were reacted at 110° C. for 5 hours while introducing air to introduce a double bond to the epoxy resin. Next, added thereto were 350 g of butyl acrylate, 20 g of glycidyl methacrylate, 1 g of divinylbenzene, 1 g of azobisdimethylvaleronitrile and 2 g of azobisisobutyronitrile, and they were reacted at 70° C. for 3 hours and further at 90° C. for one hour while introducing nitrogen into the reaction system. Then, toluene was removed at 110° C. under reduced pressure to obtain an epoxy resin composition (a) in which homogeneously dispersed was a micro cross-linking type acryl rubber fine particle (S-1) having an average particle diameter of 0.05 $\mu$m determined by a method in which the above composition was quickly cured at a low temperature in the presence of a photocuring catalyst and a breaking face morphology of the cured matter thereof was observed under an electron microscope to determine a particle diameter of the dispersed rubber particle.

It was confirmed that a content of the micro cross-linking type acryl rubber fine particle (S-1) which was calculated from the amounts of the charged monomers and the residual monomers was 37.9 mass %.

A softening point of the micro cross-linking type acryl rubber fine particle (S-1) which was determined by subjecting the epoxy resin composition (a) to TBA was −42° C.

Synthetic Example 2

Synthesis of Silicone Base Rubber-like Polymer Fine Particle (Cross-linking Type Silicone Rubber Fine Particle; S-2)-containing Epoxy Resin Composition (b)

A four neck flask of 2000 ml equipped with a stirrer, a gas inlet tube, a thermometer and a cooling tube was charged with 600 g of a bisphenol F type epoxy resin (Epiclon 830S, manufactured by Dainippon Ink and Chemicals Inc.) as a difunctional epoxy resin, 12 g of acrylic acid, 1 g of dimethylethanolamine and 50 g of toluene, and they were reacted at 110° C. for 5 hours while introducing air to introduce a double bond to the epoxy resin. Next, added thereto were 5 g of hydroxyacrylate, 10 g of butyl acrylate and 1 g of azobisisobutyronitrile, and they were reacted at 70° C. for 3 hours and further at 90° C. for one hour. Then, toluene was removed at 110° C. under reduced pressure. Next, 700 g of a silicone intermediate having a methoxy group in a molecule and 0.3 g of dibutyltin dilaurate were added thereto and reacted at 150° C. for one hour. In order to remove resulting methanol, the reaction was further continued for one hour. Added was 300 g of a mixture of this grafted resin and room temperature-curing type silicone rubber of two-liquid type in a mass ratio of 1/1, and reaction was carried out for 2 hours to obtain an S-2-containing epoxy resin composition (b) in which a cross-linking type silicone rubber fine particle was homogeneously dispersed.

It was confirmed that the above composition was the epoxy resin composition (b) in which homogeneously dispersed was a cross-linking type silicone rubber fine particle (S-2) having an average particle diameter of 1.5 μm obtained by a method in which the above composition (b) was quickly cured at a low temperature in the presence of a photocuring catalyst and a breaking face morphology of the cured matter thereof was observed under an electron microscope to determine a particle diameter of the dispersed rubber particle.

A content of the fine cross-linking type silicone rubber fine particle (S-2) which was calculated from the amount of the charged monomers was 30.0 mass %.

A softening point of the fine cross-linking type silicone rubber fine particle (S-2) which was determined by subjecting the epoxy resin composition (b) to TBA was −65° C. 7. High Softening Point-polymer Fine Particle (5)

The respective compositions prepared in the following synthetic example 3 to synthetic example 5 are used for the high softening point-polymer fine particle (5).

Synthetic Example 3
Synthesis of High Softening Point-polymer Fine Particle (P-1)

A four neck flask of 2000 ml equipped with a stirrer, a gas inlet tube, a thermometer and a reflux condenser was charged with 420.5 g of ion-exchanged water, 10 g of itaconic acid and 2.6 g of [Pelex SS-L], a product manufactured by Kao Corporation as a surfactant, which is sodium alkyldiphenyletherdisulfonate, and the temperature was elevated up to 70° C. while introducing nitrogen. At a stage of reaching the above temperature, added was 11.2 g of an initiator aqueous solution prepared by dissolving 1.2 g of potassium persulfate in 10 g of ion-exchanged water, and further added in a lump sum was a mixed solution comprising 5 g of n-butyl acrylate, 5 g of methyl methacrylate and 0.5 g of hydroxyethyl methacrylate to carry out seed polymerization at 70° C. for 20 minutes. Thereafter, continuously dropwise added in about 4 hours under an environment of the above temperature was an emulsion prepared by mechanically emulsifying a mixed monomer solution of 339 g of methyl methacrylate, 20 g of glycidyl methacrylate, 40 g of n-butyl acrylate and 2 g of 1,6-hexanediol dimethacrylate in an aqueous solution containing 1.8 g of [Pelex SS-L] described above in 160 g of ion-exchanged water. After finishing dropwise adding, the reaction was further continued at the same temperature for one hour to complete the polymerization of the residual monomers to thereby obtain an emulsion solution (Em-1) having a solid content of 39.9 mass %. Subsequently, the above solution (Em-1) was treated with a ultrafiltration apparatus using deionized water for 48 hours to remove water-soluble components for refining. The solution (Em-1) obtained after ultrafiltration refining for 48 hours had an ion conductivity of 0.03 mS/m.

The emulsion solution (Em-1) of 1,000 g obtained after ultrafiltration treatment was treated with a spray drier to obtain 388 g of powder comprising high softening point-polymer fine particles (P-1) having a moisture content of 0.1% or less.

(Em-1) was observed under an electron microscope to determine an average primary particle size of the dispersed particles to find that it was 170 nm (0.17 μm).

The high softening point-polymer fine particle (P-1) had a micro cross-linking degree of 0.5 mass % in terms of a content of the cross-linkable monomers based on the whole monomers.

The high softening point-polymer fine particle (P-1) had a gel content of 99.9%.

The high softening point polymer fine particle (P-1) had a softening point of 80° C. which was determined by TBA measurement using a hot melt film thereof.

Synthetic Example 4
Synthesis of High Softening Point-polymer Fine Particle (P-2)

A four neck flask of 2000 ml equipped with a stirrer, a gas inlet tube, a thermometer and a reflux condenser was charged with 420.5 g of ion-exchanged water, 1.5 g of 14% aqueous ammonia and 6 g of a 50 mass % aqueous solution of a water-soluble polymer having a mass average molecular weight of 3,100 comprising 0.07 mole % of stearyl methacrylate, 0.1 mole % of polyethylene glycol monomethyl ether monomethacrylate having a mass average molecular weight of 230 and 0.85 mole % of acrylic acid, and the temperature was elevated up to 70° C. while introducing nitrogen. At a stage of reaching the above temperature, added was 11 g of an initiator aqueous solution prepared by dissolving 1 g of 4,4'-azobis(4-cyanosuccinic acid) in 10 g of ion-exchanged water of 60° C., and further added in a lump sum was a mixed solution comprising 2.5 g of n-butyl acrylate, 2.5 g of methyl methacrylate and 0.3 g of hydroxyethyl methacrylate to carry out seed polymerization at 70° C. for 20 minutes. Thereafter, continuously dropwise added in about 4 hours under an environment of the above temperature was an emulsion prepared by mechanically emulsifying a mixed monomer solution of 5 g of acrylonitrile, 1 g of styrene, 332 g of methyl methacrylate, 40 g of glycidyl methacrylate, 20 g of n-butyl acrylate and 3 g of 1,4-tetramethylenediol dimethacrylate in an aqueous solution comprising 160 g of ion-exchanged water and 3.5 g of the preceding 50 mass % aqueous solution of the water-soluble polymer neutralized by aqueous ammonia. After finishing dropwise adding, the reaction was further continued at the same temperature for one hour to complete the polymerization of the residual monomers to thereby obtain an emulsion solution (Em-2) having a solid content of 39.2 mass %.

The emulsion solution (Em-2) of 1,000 g was treated with a ultrafiltration apparatus using deionized water to remove water-soluble components in 24 hours for refining. The solution (Em-2) obtained after 24 hours had an inoic conductivity of 0.02 mS/m.

The emulsion solution (Em-2) obtained after ultrafiltration treatment was treated with a spray drier to obtain 380 g of powder comprising high softening point-polymer fine particles (P-2) having a moisture content of 0.1% or less and a softening point of 76° C.

(Em-2) was measured by means of a laser irradiation type particle size-measuring equipment to determine an average primary particle size of the dispersed particles to find that it was 290 nm (0.29 μm).

The high softening point-polymer fine particle (P-2) had a micro cross-linking degree of 0.7 mass % in terms of a content of the cross-linkable monomers based on the whole monomers.

The high softening point polymer fine particle (P-2) had a gel content of 99.8% which was determined from a methylcarbitol solution.

Synthetic Example 5
Synthesis of High Softening Point-polymer Fine Particle (P-3)

A four neck flask of 2000 ml equipped with a stirrer, a gas inlet tube, a thermometer and a reflux condenser was charged with 420.5 g of ion-exchanged water, 10 g of itaconic acid, 0.5 g of [pelex SS-L], a product manufactured by Kao Corporation as a surfactant, which is sodium alkyldiphenylether-disulfonate and 2 g of publicly known [Aquaron RN-20] (brand name), a product manufactured by Daiichi Kogyo Seiyaku Co., Ltd. as a nonionic reactive surfactant, and the temperature was elevated up to 70° C. while introducing nitrogen. At a stage of reaching the above temperature, added was 11 g of an initiator aqueous solution prepared by dissolving 1 g of 2,2'-azobis[2-methyl-N-(2-hydroxyethyl)propionamide] in 10 g of ion-exchanged water, and further added in a lump sum was a mixed solution comprising 10 g of n-butyl acrylate, 109 of methyl methacrylate and 1 g of hydroxyethyl methacrylate to carry out seed polymerization at 70° C. for 30 minutes. Thereafter, continuously dropwise added in about 4 hours under an environment of the above temperature was an emulsion prepared by mechanically emulsifying a mixed monomer solution of 339 g of methyl methacrylate, 20 g of glycidyl methacrylate, 40 g of n-butyl acrylate and 2 g of 1,6-hexanediol dimethacrylate in an aqueous solution containing 0.5 g of [pelex SS-L] and 1.5 g of [Aquaron RN-20] each described above in 160 g of ion-exchanged water. After finishing dropwise adding, the reaction was further continued at the same temperature for one hour to complete the polymerization of the residual monomers to thereby obtain an emulsion solution (Em-3) having a solid content of 39.5 mass %.

The emulsion solution (Em-3) of 1,000 g was treated with a ultrafiltration apparatus using deionized water in 72 hours to remove water-soluble components for refining. The solution (Em-3) obtained after 72 hours had an ion conductivity of 0.04 mS/m. The emulsion solution (Em-3) obtained after ultrafiltration treatment was treated with a freeze drier to obtain 390 g of powder comprising a high softening point-polymer fine particles (P-3) having a moisture content of 0.14% and a softening point of 83° C.

The high softening point-polymer fine particle (P-3) was observed under an electron microscope to determine a maximum particle size of the primary dispersed particles to find that it was 1.1 μm.

8. Low Softening Point-polymer Fine Particle

A composition prepared in the following comparative synthetic example 1 is used for the low softening point-polymer fine particle for comparison.

Comparative Synthetic Example 1
Synthesis of Low Softening Point-polymer Fine Particle (Q-1)

A four neck flask of 2000 ml equipped with a stirrer, a gas inlet tube, a thermometer and a reflux condenser was charged with 420.5 g of ion-exchanged water, 10 g of itaconic acid and 2.5 g of [Pelex SS-L], a product manufactured by Kao Corporation as a surfactant, which is sodium alkyldiphenylether-disulfonate, and the temperature was elevated up to 70° C. while introducing nitrogen. At a stage of reaching the above temperature, added was 11 g of an initiator aqueous solution prepared by dissolving 1 g of 2,2'-azobis[2-methyl-N-(2-hydroxyethyl)propionamide] in 10 g of ion-exchanged water, and further added in a lump sum was a mixed solution comprising 10 g of n-butyl acrylate, 10 g of methyl methacrylate and 1 g of hydroxyethyl methacrylate to carry out seed polymerization at 70° C. for 30 minutes. Thereafter, continuously dropwise added in about 4 hours under an environment of the above temperature was an emulsion prepared by mechanically emulsifying a mixed monomer solution of 210 g of methyl methacrylate, 17 g of glycidyl methacrylate, 150 g of n-butyl acrylate and 5 g of 1,6-hexanediol dimethacrylate in an aqueous solution containing 2 g of [pelex SS-L] described above in 160 g of ion-exchanged water. After finishing dropwise adding, the reaction was further continued at the same temperature for one hour to complete the polymerization of the residual monomers to thereby obtain an emulsion solution (Em-4) having a solid content of 39.5 mass %.

The emulsion solution (Em-4) of 1,000 g was treated with a ultrafiltration apparatus using deionized water in 48 hours to remove water-soluble components for refining. The solution (Em-4) obtained after 48 hours had an ionic conductivity of 0.03 mS/m.

The emulsion solution (Em-4) obtained after ultrafiltration treatment was treated with a freeze drier to obtain 387 g of powder comprising a low softening point-polymer fine particle (Q-1) having a moisture content of 0.14% and a softening point of about 45° C.

(Q-1) was observed under an electron microscope to determine a maximum particle size of the primary dispersed particles to find that it was 0.2 μm.

Example 1

Added to a solution obtained by dissolving 30 parts of [Epiclon EP-1004] as a bisphenol A type epoxy resin in 20 parts of 1,6-hexanediol diglycidyl ether were 31.6 parts of [Epiclon 830S] as a bisphenol F type epoxy resin, 40 parts of the epoxy resin composition (a) in which homogeneously dispersed were the micro cross-linking type acryl rubber fine particles (S-1) having an average particle diameter of 0.05 μm, 30 parts of [Fuji Cure FXR-1030] as a thermally active potential curing agent for epoxy resin, 10 parts of Cat-Z-15, 2 parts of the amorphous silica-2, 8 parts of the grafted modified alumina-2, 18 parts of the high softening point-polymer fine particles (P-1) and 0.4 part of the silane coupling agent KBM403, and they were pre-mixed by means of a Dalton mixer and then kneaded by means of a three roll mill until the solid materials were pulverized to 5 μm or less to obtain a resin composition. [Micropearl AU-205] of 10 parts was added to 190 parts of the above resin composition, and they were kneaded to such an extent that bubbles did not come thereinto. Further, the composition was subjected to heat treatment at 60° C. to modify until the initial viscosity at 25° C. determined by an E type viscometer reached 2500 Pa.s. Immediately thereafter, it was cooled down and further subjected to vacuum degassing treatment at room temperature to obtain an anisotropic conductive paste (ACP-1).

The anisotropic conductive paste (ACP-1) comprises an epoxy resin having two epoxy groups on an average in a molecule and is a non-solvent type anisotropic conductive paste having the epoxy resin content of 53%, a rubber-like polymer fine particle content of 7.8%, an inorganic filler content of 5%, a high softening point-polymer fine particle content of 9%, a silane coupling agent content of 0.2%, a potential curing agent for epoxy resin content of 20% and a conductive particle content of 5 mass % (4 volume %).

Respectively shown in Table 1 are results of a storage stability test, a coating workability test, a 150° C. gel time characteristic and a free ion concentration measurement of the anisotropic conductive paste (ACP-1). Altogether shown in Table 1 are a viscosity characteristic at 80 to 120° C. by an E type viscometer of the B stage-reduced composition, and a linear expansion coefficient, Tg and a water absorption coefficient of the cured matter.

The paste (ACP-1) had a reaction starting temperature of 63° C. determined by DSC and a Top temperature of 133° C.

The paste (ACP-1) was used to repeat five times a hot connection test by means of a 190° C. hot press at a cramping pressure of 0.03 MPa/cm$^2$ for 30 seconds via a silicone rubber sheet so that the adherend reached a temperature of 120° C. after 10 seconds since hot pressing started. The result thereof is shown together in Table 1.

Example 2

An anisotropic conductive paste (ACP-2) having an initial viscosity of 4000 Pa.s at 25° C. was obtained in the same manner as in Example 1, except that the same part of the high softening point-polymer fine particle (P-2) was substituted for the high softening point-polymer fine particle (P-1).

The anisotropic conductive paste (ACP-2) comprises an epoxy resin having two epoxy groups on an average in a molecule and is a non-solvent type anisotropic conductive paste having the epoxy resin content of 53%, a rubber-like polymer fine particle content of 7.8%, an inorganic filler content of 5%, a high softening point-polymer fine particle content of 9%, a silane coupling agent content of 0.2%, a potential curing agent for epoxy resin content of 20% and a conductive particle content of 5 mass % (4 volume %).

Respectively shown in Table 1 are results of a storage stability test, a coating workability test, a 150° C. gel time characteristic and a free ion concentration measurement of the anisotropic conductive paste (ACP-2). Altogether shown in Table 1 are a viscosity characteristic at 80 to 120° C. by an E type viscometer of the B stage-reduced composition, and a linear expansion coefficient, Tg and a water absorption coefficient of the cured matter.

The paste (ACP-1) had a reaction starting temperature of 63.5° C. determined by DSC and a Top temperature of 135° C.

The paste (ACP-2) was used to repeat five times a hot connection test by means of the 190° C. hot press at a cramping pressure of 0.03 MPa/cm$^2$ for 30 seconds via a silicone rubber sheet so that the adherend reached a temperature of 130° C. after 10 seconds since hot pressing started. The result thereof is shown together in Table 1.

Example 3

Dissolved in 10 parts of 2EHG, 10 parts of t-BPMG and 10 parts of 1,6-hexanediol diglycidyl ether were 10 parts of [Epotote YDCN] which is a novolak epoxy resin and 30 parts of [Epikote EP-1004], and added to the above solution were 24.8 parts of the epoxy resin composition (b) in which homogeneously dispersed was the micro cross-linking type silicone rubber fine particles (S-2) having an average particle diameter of 1.5 μm, 64 parts of the NBDA adduct-modified potential curing agent as a potential curing agent for epoxy resin, 2 parts of the amorphous silica-1, 18 parts of the grafted modified alumina-1, 7 parts of the high softening point-polymer fine particles (P-3) and 0.2 part of the silane coupling agent KBM403. They were pre-mixed by means of a Dalton mixer and then kneaded by means of a three roll mill until the solid materials were pulverized to 5 μm or less to obtain a resin composition. [Micropearl AU-205] of 14 parts was added to 186 parts of the above resin composition, and they were kneaded to such an extent that bubbles did not come thereinto. Further, the composition was subjected to heat treatment at 60° C., and when the initial viscosity at 25° C. determined by an E type viscometer reached 2500 Pa.s, it was quenched and further subjected to vacuum degassing treatment at room temperature to obtain an anisotropic conductive paste (ACP-3).

The anisotropic conductive paste (ACP-3) comprises an epoxy resin having 1.7 epoxy group on an average in a molecule and is a non-solvent type anisotropic conductive paste having the epoxy resin content of 43.7%, a rubber-like polymer fine particle content of 3.7%, an inorganic filler content of 10%, a high softening point-polymer fine particle content of 3.5%, a silane coupling agent content of 0.1%, a potential curing agent for epoxy resin content of 32% and a conductive particle content of 7 mass % (5.5 volume %).

Respectively shown in Table 1 are results of a storage stability test, a coating workability test, a 150° C. gel time characteristic and a free ion concentration measurement of the anisotropic conductive paste (ACP-3). Altogether shown in Table 1 are a viscosity characteristic at 80 to 120° C. by an E type viscometer of the B stage-reduced composition, and a linear expansion coefficient, Tg and a water absorption coefficient of the cured matter.

The paste (ACP-3) had a reaction starting temperature of 47° C. determined by DSC and a Top temperature of 111° C.

The paste (ACP-3) was used to repeat five times the hot connection test by means of a 200° C. hot press at a cramping pressure of 0.03 MPa/cm$^2$ for 30 seconds via a silicone rubber sheet so that the adherend reached a temperature of 130° C. after 10 seconds since hot pressing started. The result thereof is shown together in Table 1.

Example 4

Dissolved in 20 parts of 1,6-hexanediol diglycidyl ether was 50 parts of [Epikote EP-1001] which is a bisphenol A type epoxy resin, and added to the above solution were 20 parts of [Adeka 4000] as a flexible epoxy resin, 25 parts of the epoxy resin composition (b) in which homogeneously dispersed was the micro cross-linking type silicone rubber fine particles (S-2) having an average particle diameter of 1.5 μm, 60 parts of the NBDA adduct-modified potential curing agent as a potential curing agent for epoxy resin, 20 parts of Cat-Z-15 and 10 parts of the high softening point-polymer fine particles (P-3). They were pre-mixed by means of a Dalton mixer and then kneaded by means of a three roll mill until the solid materials were pulverized to 5 μm or less to obtain a resin composition. [Micropearl AU-205] of 10 parts was added to 190 parts of the above resin composition, and they were kneaded to such an extent that bubbles did not come thereinto. Further, the composition was subjected to heat treatment at 40° C., and when the initial viscosity at 25° C. determined by an E type viscometer reached 4500 Pa.s, it was quenched and further subjected to vacuum degassing treatment at room temperature to obtain an anisotropic conductive paste (ACP-4).

The anisotropic conductive paste (ACP-4) comprises an epoxy resin having 2 epoxy groups on an average in a molecule and is a non-solvent type anisotropic conductive paste having an epoxy resin content of 46.25%, a rubber-like polymer fine particle content of 3.75%, a high softening point-polymer fine particle content of 5%, a potential curing agent for epoxy resin content of 40% and a conductive particle content of 5 mass % (4 volume %).

Respectively shown in Table 1 are results of a storage stability test, a coating workability test, a 150° C. gel time characteristic and a free ion concentration measurement of the anisotropic conductive paste (ACP-4). Altogether shown in Table 1 are a viscosity characteristic at 80 to 120° C. by an E type viscometer of the B stage-reduced composition, and a linear expansion coefficient, Tg and a water absorption coefficient of the cured matter.

The paste (ACP-4) had a reaction starting temperature of 45° C. determined by DSC and a Top temperature of 98° C.

The paste (ACP-4) was used to repeat five times the hot connection test by means of a 190° C. hot press at a cramping pressure of 0.03 MPa/cm$^2$ for 30 seconds via a silicone rubber sheet in the same manner as in Example 1. The result thereof is shown together in Table 1.

Example 5

Dissolved in 20 parts of 1,6-hexanediol diglycidyl ether were 25 parts of [Epikote EP-1004] which is a bisphenol A type epoxy resin and 25 parts of [Epotote YDCN] which is a novolak type epoxy resin, and added to the above solution were 20 parts of [Epiclon 830S] as a bisphenol F type liquid epoxy resin, 40 parts of the epoxy resin composition (a) in which homogeneously dispersed was the micro cross-linking type acryl rubber fine particle (S-1) having an average particle diameter of 0.05 μm, 30 parts of Cat-Z-15, 18 parts of the high softening point-polymer fine particles (P-2), 2 parts of the amorphous silica-2 and 10 parts of the grafted modified alumina-2. They were pre-mixed by means of a Dalton mixer and then kneaded by means of a three roll mill until the solid materials were pulverized to 5 μm or less to obtain a resin composition. [Micropearl AU-205] of 10 parts was added to 190 parts of the above resin composition, and they were kneaded to such an extent that bubbles did not come thereinto to obtain an anisotropic conductive paste (ACP-5) having an initial viscosity at 25° C. of 500 to 700 Pa.s determined by an E type viscometer.

The anisotropic conductive paste (ACP-5) comprises an epoxy resin having 2.3 epoxy groups on an average in a molecule and is a non-solvent type anisotropic conductive paste of having an epoxy resin content of 57.7%, a rubber-like polymer fine particle content of 7.3%, a high softening point-polymer fine particle content of 9% a potential curing agent for epoxy resin content of 15%, an inorganic filler content of 6% and a conductive particle content of 5 mass % (4 volume %).

Respectively shown in Table 1 are results of a storage stability test, a coating workability test, a 150° C. gel time characteristic and a free ion concentration measurement of the anisotropic conductive paste (ACP-5). Altogether shown in Table 1 are a viscosity characteristic at 80 to 120° C. by an E type viscometer of the B stage-reduced composition, and a linear expansion coefficient, Tg and a water absorption coefficient of the cured matter.

The paste (ACP-5) had a reaction starting temperature of 76° C. determined by DSC and a Top temperature of 124° C.

The paste (ACP-5) was used to repeat five times the hot connection test by means of a 190° C. hot press at a cramping pressure of 0.03 MPa/cm$^2$ for 30 seconds via a silicone rubber sheet in the same manner as in Example 1. The result thereof is shown together in Table 1.

Comparative Example 1

A comparative anisotropic conductive paste (ACP-B1) was prepared in the same manner as in Example 1, except that 31.6 parts of a bisphenol F type epoxy resin [Epiclon 830] was substituted for 31.6 parts of a bisphenol F type epoxy resin [Epiclon 830S] and 8 parts of amorphous alumina was substituted for 8 parts of the grafted modified alumina-2 and that the high softening point-polymer fine particles (P-1) were not added.

The anisotropic conductive paste (ACP-B1) comprises an epoxy resin having two epoxy groups on an average in a molecule and is a non-solvent type anisotropic conductive paste having the epoxy resin content of 58.2%, a rubber-like polymer fine particle content of 8.57%, an inorganic filler content of 5.49%, a silane coupling agent content of 0.22%, a potential curing agent for epoxy resin content of 21.98% and a conductive particle content of 5.5 mass % (4.5 volume %).

Respectively shown in Table 1 are results of a storage stability test, a coating workability test, a 150° C. gel time characteristic and a free ion concentration measurement of the anisotropic conductive paste (ACP-B1). Altogether shown in Table 1 are a viscosity characteristic at 80 to 120° C. by an E type viscometer of the B stage-reduced composition, and a linear expansion coefficient, Tg and a water absorption coefficient of the cured matter.

The paste (ACP-B1) had a reaction starting temperature of 63.5° C. determined by DSC and a Top temperature of 133° C.

The paste (ACP-1) was used to repeat five times the hot connection test by means of a 190° C. hot press at a cramping pressure of 0.03 MPa/cm$^2$ for 30 seconds via a silicone rubber sheet so that the adherend reached a temperature of 120° C. after 10 seconds since hot pressing started. The result thereof is shown together in Table 1.

Comparative Example 2

Added to a solution obtained by dissolving 30 parts of [Epiclon EP-1004] as a bisphenol A type epoxy resin in 20 parts of 1,6-hexanediol diglycidyl ether were 1.6 part of [Epiclon 830] as a non-refined general purpose bisphenol F type epoxy resin, 30 parts of [Fuji Cure FXR-1030] as a thermally active potential curing agent for epoxy resin, 10 parts of Cat-Z-15, 2 parts of the amorphous silica-2, 8 parts of the amorphous alumina-1, 58 parts of the high softening point-polymer fine particles (P-1) and 0.4 part of the silane coupling agent KBM403, and they were pre-mixed by means of a Dalton mixer and then kneaded by means of a three roll mill until the solid materials were pulverized to 5 μm or less to obtain a resin composition. [Micropearl AU-205] of 10 parts was added to 190 parts of the above resin composition, and they were kneaded to such an extent that bubbles did not come thereinto and subjected to vacuum degassing treatment to obtain a comparative anisotropic conductive paste (ACP-B2).

The anisotropic conductive paste (ACP-B2) comprises an epoxy resin having two epoxy groups on an average in a molecule and is a non-solvent type anisotropic conductive paste having the epoxy resin content of 40.8%, a rubber-like polymer fine particle content of 0%, an inorganic filler content of 5%, a low softening point-polymer fine particle content of 29%, a potential curing agent for epoxy resin content of 20%, a silane coupling agent content of 0.2% and a conductive particle content of 5 mass % (4 volume %).

Altogether shown in Table 1 are results of a storage stability test, a coating workability test and a 150° C. gel time characteristic of the anisotropic conductive paste (ACP-B2).

The paste (ACP-B2) had a reaction starting temperature of 69° C. determined by DSC and a Top temperature of 138° C.

The paste (ACP-B2) was used to repeat five times the hot connection test by means of a 190° C. hot press at a cramping pressure of 0.03 MPa/cm² for 30 seconds via a silicone rubber sheet so that the adherend matter reached a temperature of 120° C. after 10 seconds since hot pressing started. The result thereof is shown together in Table 1.

Comparative Example 3

A comparative anisotropic conductive paste (ACP-B3) was produced in the same manner as in Example 1, except that the same parts of the low softening point-polymer fine particles (Q-1) was substituted for the high softening point-polymer fine particle (P-1).

A viscosity of the comparative anisotropic conductive paste (ACP-B3) at 25° C. was not stable, and a marked change with the passage of time was observed. The viscosity at the same temperature after 12 hours passed exhibited a change exceeding three times the viscosity at the initial time. Accordingly, the comparative anisotropic conductive paste (ACP-B3) was lacking in a coating work stability and was not used for the subsequent hot connection test.

Industrial Applicability

The anisotropic conductive paste of the present invention is suited to a hot bonding system by a normal hot press and has a high adhesion reliability in primary curing, and the cured matter thereof has as high heat deformation temperature as 100° C. and is markedly low in bleeding and resin leaking. Also, the cured matter thereof is excellent in a low water absorbing property and exhibits a low linear expansion coefficient characteristic, and it is excellent as well in a dimensional stability. Further, it is excellent as well in storage stability and coating workability and therefore can be stored over a long period of time, and handling thereof is easy.

Accordingly, the anisotropic conductive paste of the present invention can be utilized for electrically connecting electric circuits or forming an electric connection circuit of a liquid crystal display board with a semiconductor IC and/or an IC-loaded circuit board.

TABLE 1

|  | Example | | | | | Comparative Example | | |
| --- | --- | --- | --- | --- | --- | --- | --- | --- |
|  | 1 | 2 | 3 | 4 | 5 | 1 | 2 | 3 |
| Anisotropic conductive paste | ACP-1 | ACP-2 | ACP-3 | ACP-4 | ACP-5 | ACP-1B | ACP-2B | ACP-3B |
| Storage stability test | ○ | ○ | ○ | ○ | ○ | ○ | Δ | x |
| Coating workability test | ○ | ○ | ○ | ○ | ○ | ○ | ○ | x |
| Free ion concentration characteristic | ○ | ○ | ○ | ○ | ○ | Δ | Δ | — |
| 150° C. gel time | 16 sec | 16 sec | 23 sec | 19 sec | 13 sec | 25 sec | 18 sec | Not enforced |
| Temporary adhesive property | ○ | ○ | ○ | ○ | ○ | x | ○ | Not enforced |
| Water absorption coefficient of cured matter (%) | 1.8 | 1.9 | 1.7 | 1.7 | 1.9 | 2.2 | 2.5 | — |
| Linear expansion coefficient ($\times 10^{-5}$ mm/mm/° C.) | 8.5 | 8.7 | 9.4 | 9.9 | 8.2 | 11 | 13 | — |
| Heat deformation temperature Tg | 124 | 122 | 107 | 101 | 131 | 125 | 103 | — |
| Viscosity characteristic of B stage-reduced product at 80 to 100° C. | ○ | ○ | ○ | ○ | ○ | x | ⊙ | — |
| Hot connection test |  |  |  |  |  |  |  |  |
| Presence of resin leak | None | None | None | None | None | Present | None |  |
| Presence of bubbles | None | None | None | None | None | Present | None |  |
| Anisotropic conductive characteristic |  |  |  |  |  |  |  |  |
| Insulating property between longitudinal electrodes Ω · cm | >10¹² | >10¹² | >10¹² | >10¹² | >10¹² | shorted | >10¹² |  |
| Conductivity between vertical electrodes | 4 to 5 | 3 to 4 | 2 to 3 | 4 to 5 | 4 to 5 | 5 to 500 | 50 to 1500 |  |
| Repeatability(*1) | ○ | ○ | ○ | ○ | ○ | x | x |  |
| Test of peeling cell by wedge | ⊙ | ⊙ | ○ | ⊙ | ○ | ○ | Δ |  |
| Evaluation of sticking out property | ○ | ○ | ○ | ○ | ○ | x | ○ |  |

(*1)(repeatability): the presence of scattering in the repetitive test of five times and the anisotropic conductive resistance value in the same cell is shown by symbols; the symbol ○ means that the repeatability is excellent and nothing abnormal is found in the boards as well as the vertical electrodes: and the symbol x means that the measured values are scattered to a large extent depending on the cells.

What is claimed is:

1. An anisotropic conductive paste comprising conductive fine particles and an epoxy resin composition, wherein
   (a) an aqueous solution obtained by admixing the anisotropic conductive paste with the same mass of purified water has an ionic conductivity of 1 mS/m or less and
   (b) a coated material obtained by coating the anisotropic conductive paste in a thickness of 50 µm and subjecting it to heat treatment at 80 to 100° C. for 20 minutes has a viscosity of 50 to 10000 Pa.s at 80 to 100° C. by an E type viscometer, and
   (c) the cured matter of the anisotropic conductive paste has a linear expansion coefficient of $10 \times 10^{-5}$ mm/mm/° C. or less at 0 to 100° C., which is determined by means of a thermomechanical analyzer (TMA),
   (d) the cured matter of the anisotropic conductive paste has a heat deformation temperature Tg of 100° C. or higher, which is determined by means of a thermomechanical analyzer (TMA),
   (e) the cured matter of the anisotropic conductive paste has a water absorption coefficient of 2 mass % or less, and
   (f) the cured matter of the anisotropic conductive paste has a specific resistance of $1 \times 10^9 \Omega$.cm or more.

2. The anisotropic conductive paste as described in claim 1, wherein the epoxy resin composition comprises:
   (1) 30 to 93 mass % of an epoxy resin having 1.2 or more epoxy groups on an average in a molecule,
   (2) 1 to 15 mass % of a rubber-like polymer fine particle having a softening point of 0° C. or lower and a primary particle diameter of 5 µm or less,
   (3) 5 to 60 mass % of a thermally active potential curing agent for epoxy resin, and
   (4) 1 to 20 mass % of a high softening point-polymer fine particle having a softening point of 50° C. or higher and a primary particle diameter of 2 µm or less; and the anisotropic conductive paste comprises 93 to 97 volume % of the epoxy resin composition comprising the components (1) to (4) described above and
   (5) 3 to 7 volume % of conductive particles having an average particle diameter of 5 to 15 µm, a maximum particle diameter of 20 µm or less and a minimum particle diameter of 0.1 µm or more.

3. An anisotropic conductive paste comprising conductive fine particles and an epoxy resin composition, wherein the epoxy resin composition comprises:
   (1) 30 to 93 mass % of an epoxy resin having 1.2 or more epoxy groups on an average in a molecule,
   (2) 1 to 15 mass % of a rubber-like polymer fine particle having a softening point of 0° C. or lower and a primary particle diameter of 5 µm or less,
   (3) 5 to 60 mass % of a thermally active potential curing agent for epoxy resin, and
   (4) 1 to 20 mass % of a high softening point-polymer fine particle having a softening point of 50° C. or higher and a primary particle diameter of 2 µm or less; and the anisotropic conductive paste comprises 93 to 97 volume % of the epoxy resin composition comprising the components (1) to (4) described above and
   (5) 3 to 7 volume % of conductive particles having an average particle diameter of 5 to 15 µm, a maximum particle diameter of 20 µm or less and a minimum particle diameter of 0.1 µm or more.

4. The anisotropic conductive paste as described in claim 3, further comprising 1 to 10 mass % of an inorganic filler (6).

5. The anisotropic conductive paste as described in claim 3, further comprising 0.1 to 5 mass % of a silane coupling agent (7).

6. The anisotropic conductive paste as described in claim 3, wherein a maximum exothermic peak temperature determined from a thermogram obtained by differential scanning calorimetry (DSC) in which 10 mg of the anisotropic conductive paste is heated at a constant rate of 5° C./minute in an inert gas atmosphere is 80 to 180° C.

7. The anisotropic conductive paste as described in claim 3, comprising a single liquid type epoxy resin composition, wherein an exothermic initiation temperature determined from a thermogram obtained by differential scanning calorimetry (DSC) in which 10 mg of the anisotropic conductive paste is heated at a constant rate of 5° C./minute in an inert gas atmosphere is 30 to 130° C.

8. The anisotropic conductive paste as described in claim 3, wherein the epoxy resin (1) is an epoxy resin having 1.7 or more epoxy groups on an average in a molecule and has a polystyrene-reduced number average molecular weight of 7000 or less which is determined by gel permeation chromatography.

9. The anisotropic conductive paste as described in claim 3, wherein the components (2), (4) and (5) are present in the state that they are dispersed in the epoxy resin in the form of particles respectively.

10. The anisotropic conductive paste as described in claim 3, wherein the component (4) is a high softening point-polymer fine particle which comprises a poly(meth)acrylate having a micro cross-linking structure as a main component which has a softening point of 60 to 150° C. and a primary particle diameter falling in a range of 0.01 to 5 µm, in which an epoxy group is introduced into a polymer component in a proportion of 0.1 to 5 mass %.

11. The anisotropic conductive paste as described in claim 3, wherein the component (5) comprises a core of an organic polymer and a coated layer of at least one metal selected from gold, silver, copper and nickel or an alloy thereof.

12. The anisotropic conductive paste as described in claim 3, wherein the rubber-like polymer fine particle (2) and the high softening point-polymer fine particle (4) form a core/shell type composite fine particle in which the rubber-like polymer fine particle (2) forms the core phase and the high softening point-polymer fine particle (4) forms the shell phase.

13. A method of forming an electric connection circuit of a liquid crystal display board with a semiconductor IC and/or an IC-loaded circuit board by dispenser-coating the anisotropic conductive paste as described in claim 1 on a part of the liquid crystal display board to be electrically connected with the semiconductor IC and/or the IC-loaded circuit board and press bonding them by means of a normal hot press at a lower temperature than 250° C. conductive paste to thereby make vertically conductive and form an electric conductive circuit.

14. A method of forming an electric connection circuit of a liquid crystal display board with a semiconductor IC and/or an IC-loaded circuit board by dispenser-coating the anisotropic conductive paste as described in claim 2 on a part of the liquid crystal display board to be electrically connected with the semiconductor IC and/or the IC-loaded circuit board and press bonding them by means of a normal hot press at a lower temperature than 250° C. conductive paste to thereby make vertically conductive and form an electric conductive circuit.

15. A method of forming an electric connection circuit of a liquid crystal display board with a semiconductor IC and/or an IC-loaded circuit board by dispenser-coating the anisotropic conductive paste as described in claim 3 on a part of the liquid crystal display board to be electrically connected with the semiconductor IC and/or the IC-loaded circuit board and press bonding them by means of a normal hot press at a lower temperature than 250° C. conductive paste to thereby make vertically conductive and form an electric conductive circuit.

16. A method of forming an electric connection circuit of a liquid crystal display board with a semiconductor IC and/or an IC-loaded circuit board by dispenser-coating the anisotropic conductive paste as described in claim 4 on a part of the liquid crystal display board to be electrically connected with the semiconductor IC and/or the IC-loaded circuit board and press bonding them by means of a normal hot press at a lower temperature than 250° C. conductive paste to thereby make vertically conductive and form an electric conductive circuit.

17. A method of forming an electric connection circuit of a liquid crystal display board with a semiconductor IC and/or an IC-loaded circuit board by dispenser-coating the anisotropic conductive paste as described in claim 5 on a part of the liquid crystal display board to be electrically connected with the semiconductor IC and/or the IC-loaded circuit board and press bonding them by means of a normal hot press at a lower temperature than 250° C. conductive paste to thereby make vertically conductive and form an electric conductive circuit.

18. A method of forming an electric connection circuit of a liquid crystal display board with a semiconductor IC and/or an IC-loaded circuit board by dispenser-coating the anisotropic conductive paste as described in claim 6 on a part of the liquid crystal display board to be electrically connected with the semiconductor IC and/or the IC-loaded circuit board and press bonding them by means of a normal hot press at a lower temperature than 250° C. conductive paste to thereby make vertically conductive and form an electric conductive circuit.

19. A method of forming an electric connection circuit of a liquid crystal display board with a semiconductor IC and/or an IC-loaded circuit board by dispenser-coating the anisotropic conductive paste as described in claim 7 on a part of the liquid crystal display board to be electrically connected with the semiconductor IC and/or the IC-loaded circuit board and press bonding them by means of a normal hot press at a lower temperature than 250° C. conductive paste to thereby make vertically conductive and form an electric conductive circuit.

20. A method of forming an electric connection circuit of a liquid crystal display board with a semiconductor IC and/or an IC-loaded circuit board by dispenser-coating the anisotropic conductive paste as described in claim 8 on a part of the liquid crystal display board to be electrically connected with the semiconductor IC and/or the IC-loaded circuit board and press bonding them by means of a normal hot press at a lower temperature than 250° C. conductive paste to thereby make vertically conductive and form an electric conductive circuit.

21. A method of forming an electric connection circuit of a liquid crystal display board with a semiconductor IC and/or an IC-loaded circuit board by dispenser-coating the anisotropic conductive paste as described in claim 9 on a part of the liquid crystal display board to be electrically connected with the semiconductor IC and/or the IC-loaded circuit board and press bonding them by means of a normal hot press at a lower temperature than 250° C. conductive paste to thereby make vertically conductive and form an electric conductive circuit.

22. A method of forming an electric connection circuit of a liquid crystal display board with a semiconductor IC and/or an IC-loaded circuit board by dispenser-coating the anisotropic conductive paste as described in claim 10 on a part of the liquid crystal display board to be electrically connected with the semiconductor IC and/or the IC-loaded circuit board and press bonding them by means of a normal hot press at a lower temperature than 250° C. conductive paste to thereby make vertically conductive and form an electric conductive circuit.

23. A method of forming an electric connection circuit of a liquid crystal display board with a semiconductor IC and/or an IC-loaded circuit board by dispenser-coating the anisotropic conductive paste as described in claim 11 on a part of the liquid crystal display board to be electrically connected with the semiconductor IC and/or the IC-loaded circuit board and press bonding them by means of a normal hot press at a lower temperature than 250° C. conductive paste to thereby make vertically conductive and form an electric conductive circuit.

24. A method of forming an electric connection circuit of a liquid crystal display board with a semiconductor IC and/or an IC-loaded circuit board by dispenser-coating the anisotropic conductive paste as described in claim 12 on a part of the liquid crystal display board to be electrically connected with the semiconductor IC and/or the IC-loaded circuit board and press bonding them by means of a normal hot press at a lower temperature than 250° C. conductive paste to thereby make vertically conductive and form an electric conductive circuit.

\* \* \* \* \*